(12) United States Patent
Olsson

(10) Patent No.: US 8,172,434 B1
(45) Date of Patent: May 8, 2012

(54) SUBMERSIBLE MULTI-COLOR LED ILLUMINATION SYSTEM

(75) Inventor: Mark S. Olsson, La Jolla, CA (US)

(73) Assignee: DeepSea Power and Light, Inc., San Diego, CA (US)

( * ) Notice: Subject to any disclaimer, the term of this patent is extended or adjusted under 35 U.S.C. 154(b) by 0 days.

(21) Appl. No.: 12/815,361

(22) Filed: Jun. 14, 2010

Related U.S. Application Data

(62) Division of application No. 12/036,178, filed on Feb. 22, 2008, now abandoned.

(60) Provisional application No. 60/891,463, filed on Feb. 23, 2007.

(51) Int. Cl.
*F21V 7/04* (2006.01)

(52) U.S. Cl. .................... 362/346; 362/241; 362/249.02; 362/800

(58) Field of Classification Search .................. 362/230, 362/235, 241, 236, 237, 243, 247, 249.02, 362/346, 296.05, 297
See application file for complete search history.

(56) References Cited

U.S. PATENT DOCUMENTS

| | | | |
|---|---|---|---|
| 2,604,316 A | 7/1952 | O'Brien et al. ............... 267/159 |
| 3,596,136 A | 7/1971 | Fischer | |
| 4,727,457 A | 2/1988 | Thillays ........................ 362/582 |
| 4,740,259 A | 4/1988 | Heinen ......................... 156/234 |
| 4,841,344 A | 6/1989 | Heinen .......................... 257/98 |
| 4,983,009 A | 1/1991 | Musk ............................. 385/35 |
| 5,050,040 A | 9/1991 | Gondusky et al. ............ 361/708 |
| 5,403,773 A | 4/1995 | Nitta et al. | |
| 5,580,156 A * | 12/1996 | Suzuki et al. ................. 362/184 |
| 5,785,418 A | 7/1998 | Hochstein ..................... 362/373 |
| 6,416,198 B1 | 7/2002 | Vanderschuit ................ 362/101 |
| 6,582,100 B1 | 6/2003 | Hochstein et al. ............ 362/294 |
| 6,781,209 B1 | 8/2004 | Althaus et al. ................ 257/432 |
| 6,874,910 B2 | 4/2005 | Sugimoto et al. ............ 362/294 |
| 6,930,332 B2 * | 8/2005 | Hashimoto et al. ............ 257/98 |
| 6,949,894 B1 * | 9/2005 | Sullivan et al. ............... 315/362 |
| 6,966,674 B2 | 11/2005 | Tsai .............................. 362/294 |
| 7,134,769 B2 | 11/2006 | Rohlfing et al. .............. 362/331 |
| 7,196,459 B2 | 3/2007 | Morris ............................ 313/46 |
| 7,396,139 B2 | 7/2008 | Savage .......................... 362/101 |
| 7,566,154 B2 * | 7/2009 | Gloisten et al. ............... 362/545 |
| 2001/0030866 A1 | 10/2001 | Hochstein ..................... 362/294 |
| 2004/0012958 A1 | 1/2004 | Hashimoto et al. ........... 362/241 |

(Continued)

FOREIGN PATENT DOCUMENTS

| | | |
|---|---|---|
| GB | 2413840 A * | 11/2005 |
| JP | 60-161684 | 8/1985 |
| JP | 2005166775 A | 6/2005 |

*Primary Examiner* — Jong-Suk (James) Lee
*Assistant Examiner* — Leah S Macchiarolo
(74) *Attorney, Agent, or Firm* — Steven C. Tietsworth

(57) ABSTRACT

A submersible LED illumination system may include an array of LEDs, with a first portion of the LEDs capable of emitting white light and a second portion of the LEDs capable of emitting light of a single color. The system may further include a plurality of reflectors surrounding a corresponding one of the LEDs, where a first portion of the reflectors may be configured to provide a far field relatively narrow beam of illumination and a second portion of the reflectors may be configured to provide a near field relatively wide beam of illumination. A housing may enclose the array of LEDs and the reflectors. A transparent window may be disposed in the housing, an an optically clear material may be disposed between the LEDs, reflectors, and transparent window.

26 Claims, 27 Drawing Sheets

U.S. PATENT DOCUMENTS

| | | | |
|---|---|---|---|
| 2004/0264195 A1 | 12/2004 | Chang et al. | 362/294 |
| 2005/0237747 A1* | 10/2005 | Shimizu et al. | 362/294 |
| 2007/0109788 A1 | 5/2007 | Pan | 362/294 |
| 2007/0189010 A1 | 8/2007 | Arai | 362/257 |

* cited by examiner

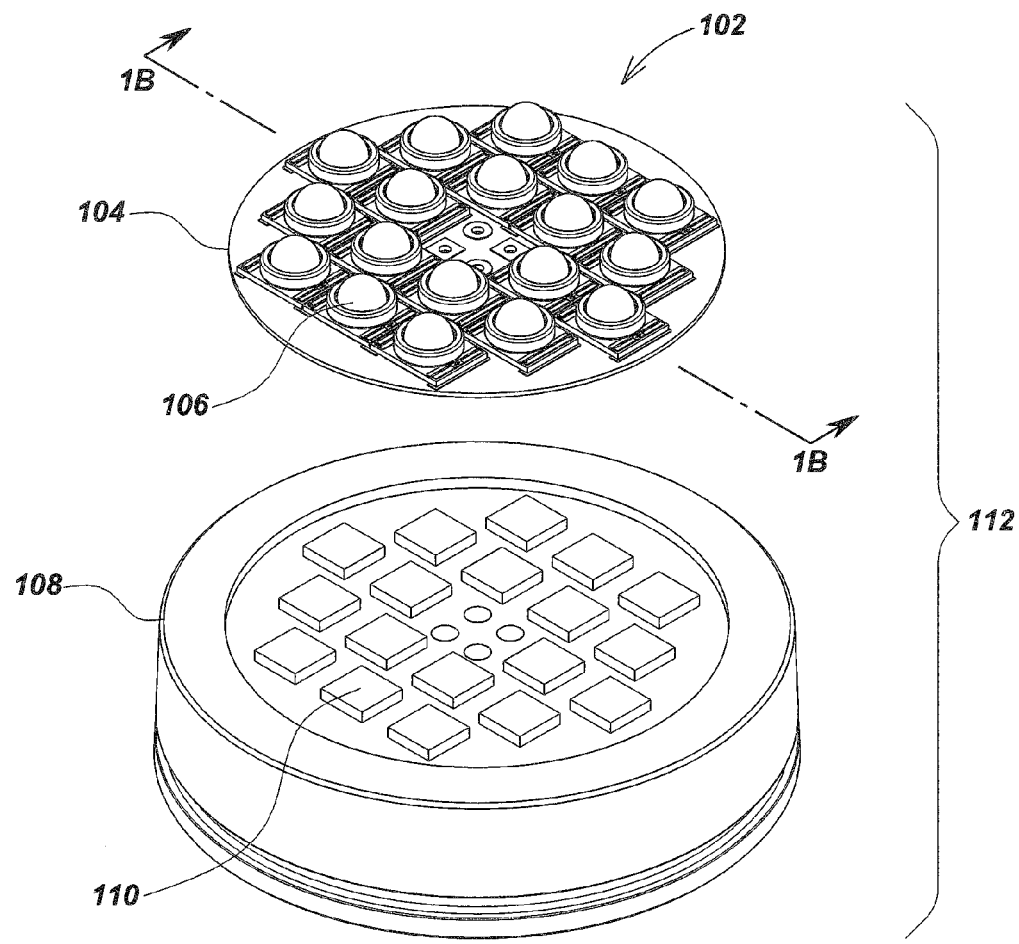
FIG. 1A
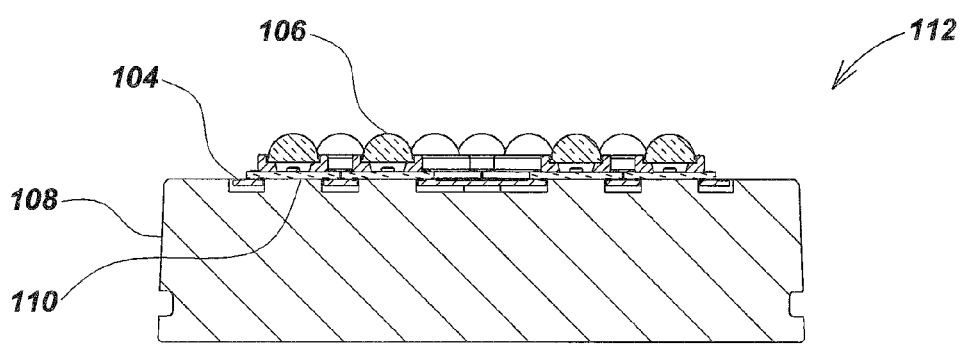
FIG. 1B

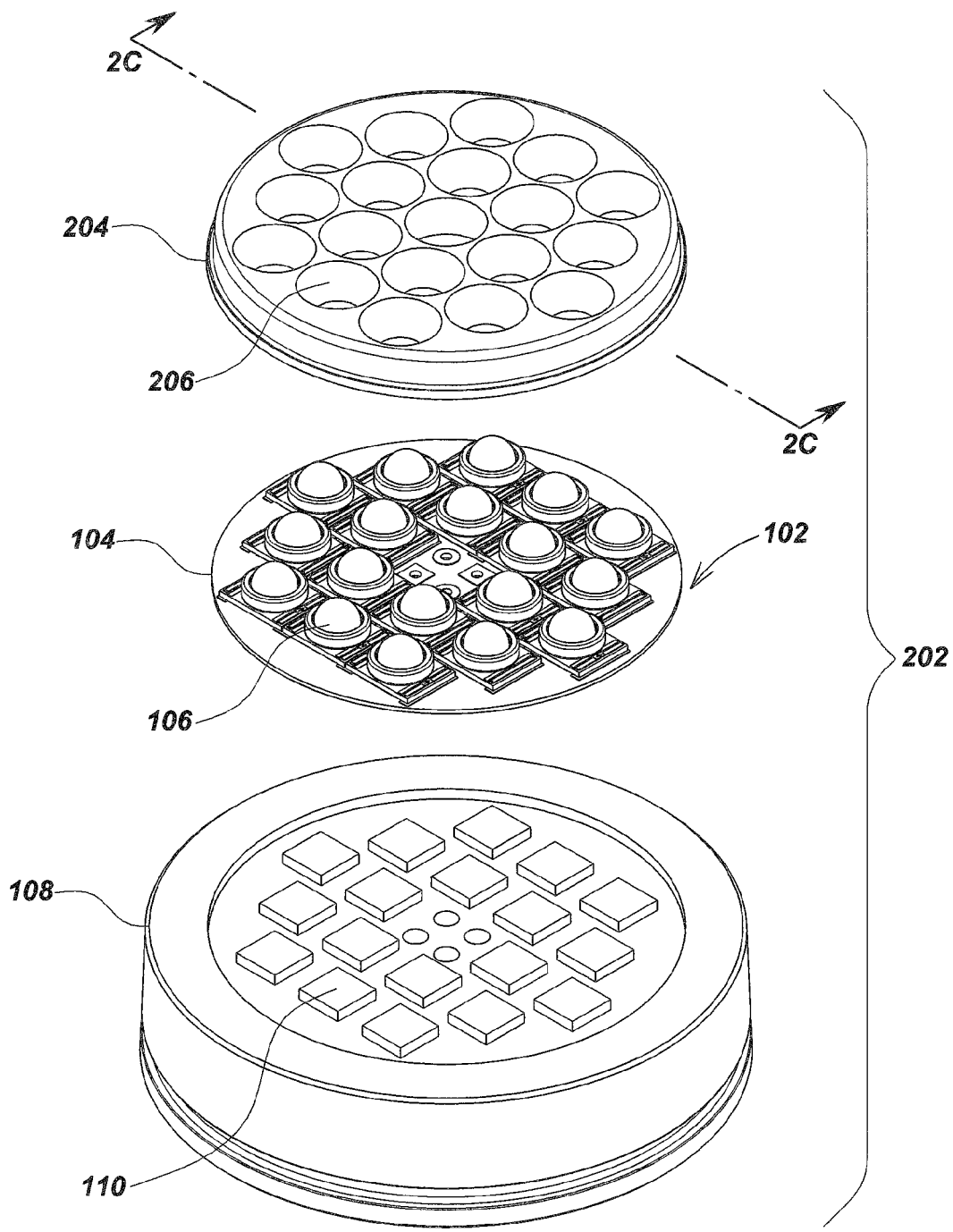
FIG. 2A

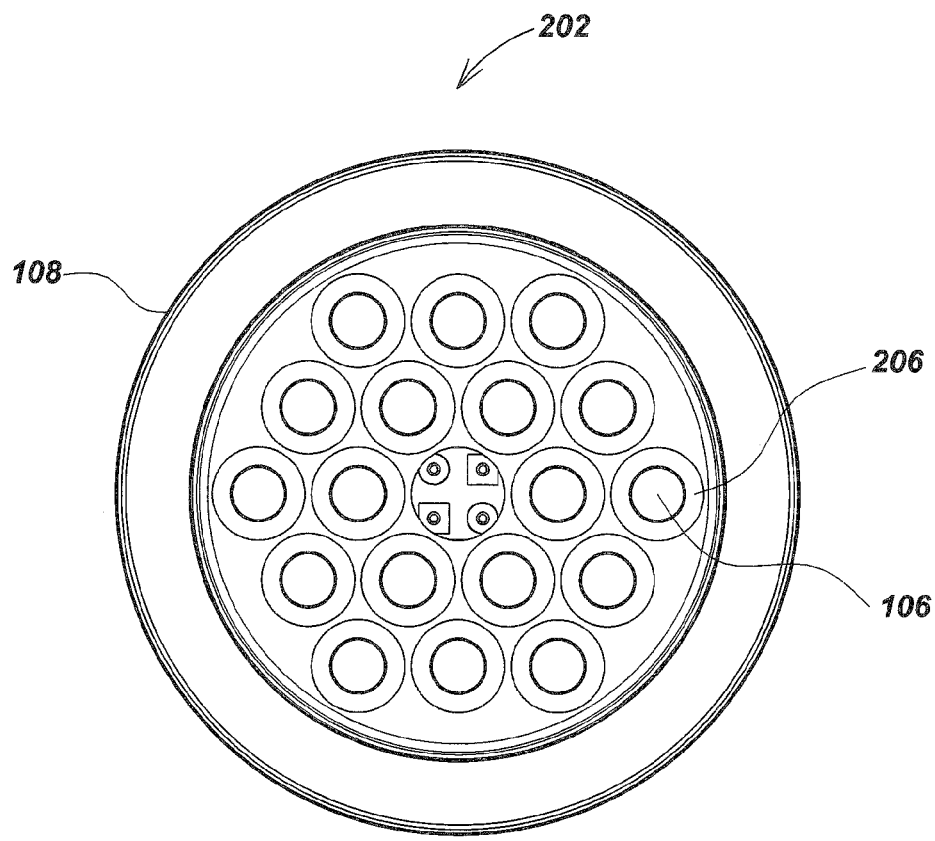
FIG. 2B
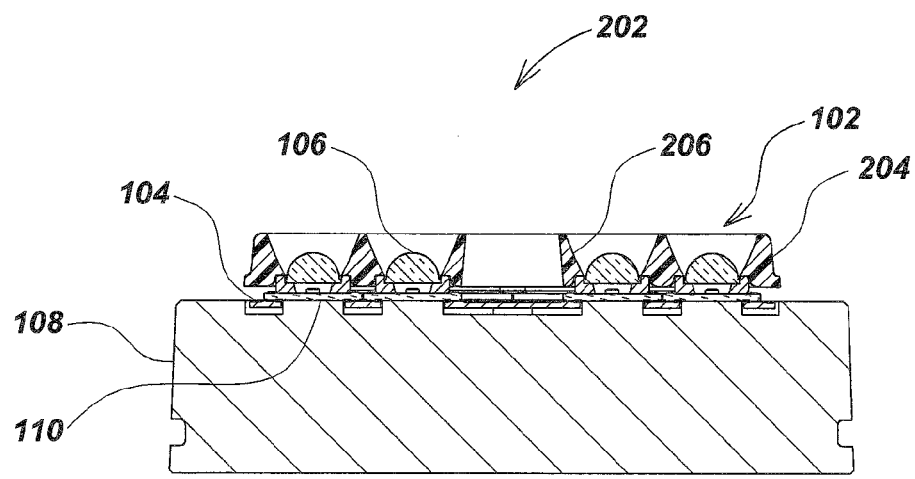
FIG. 2C

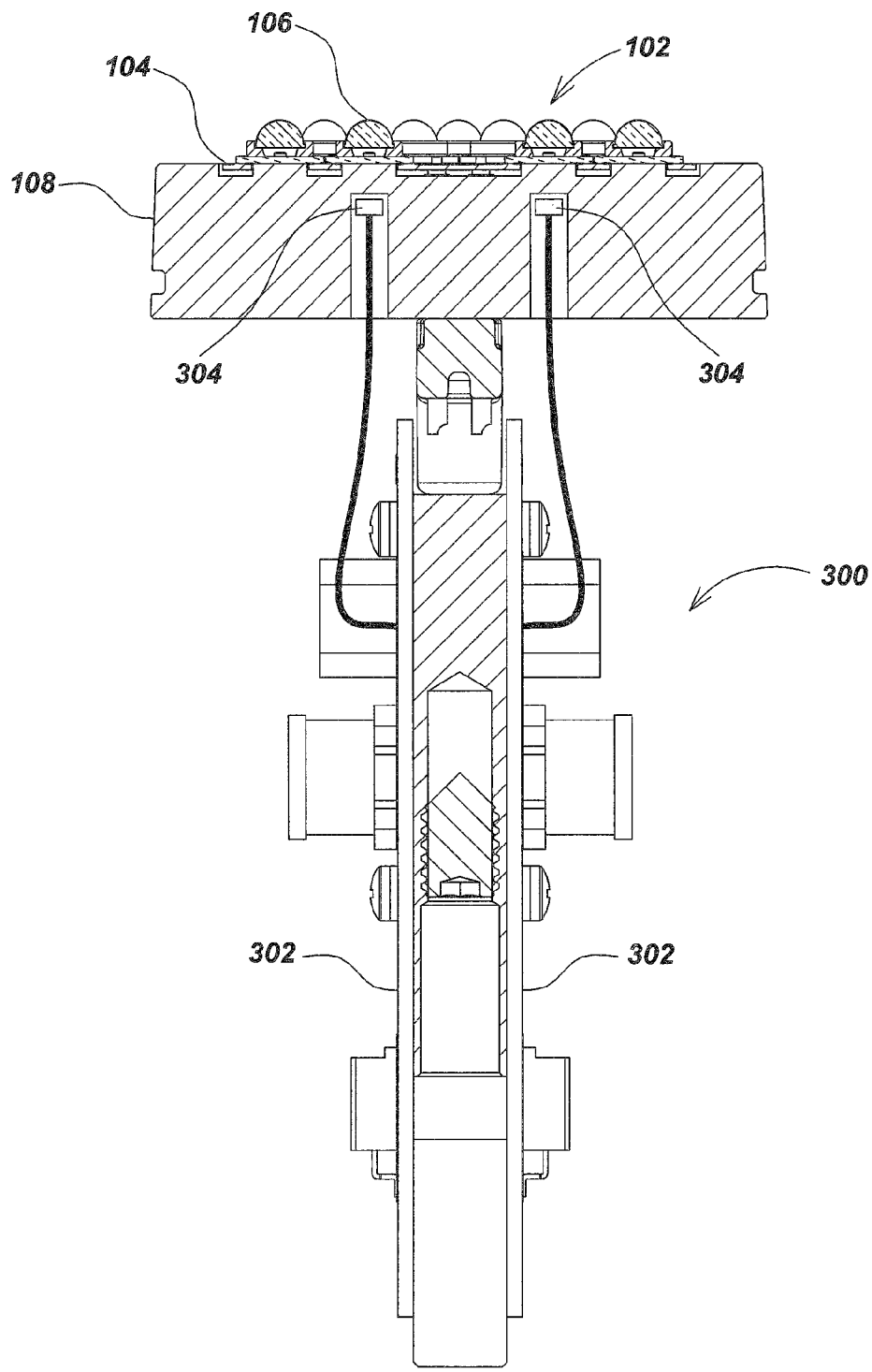
FIG. 3

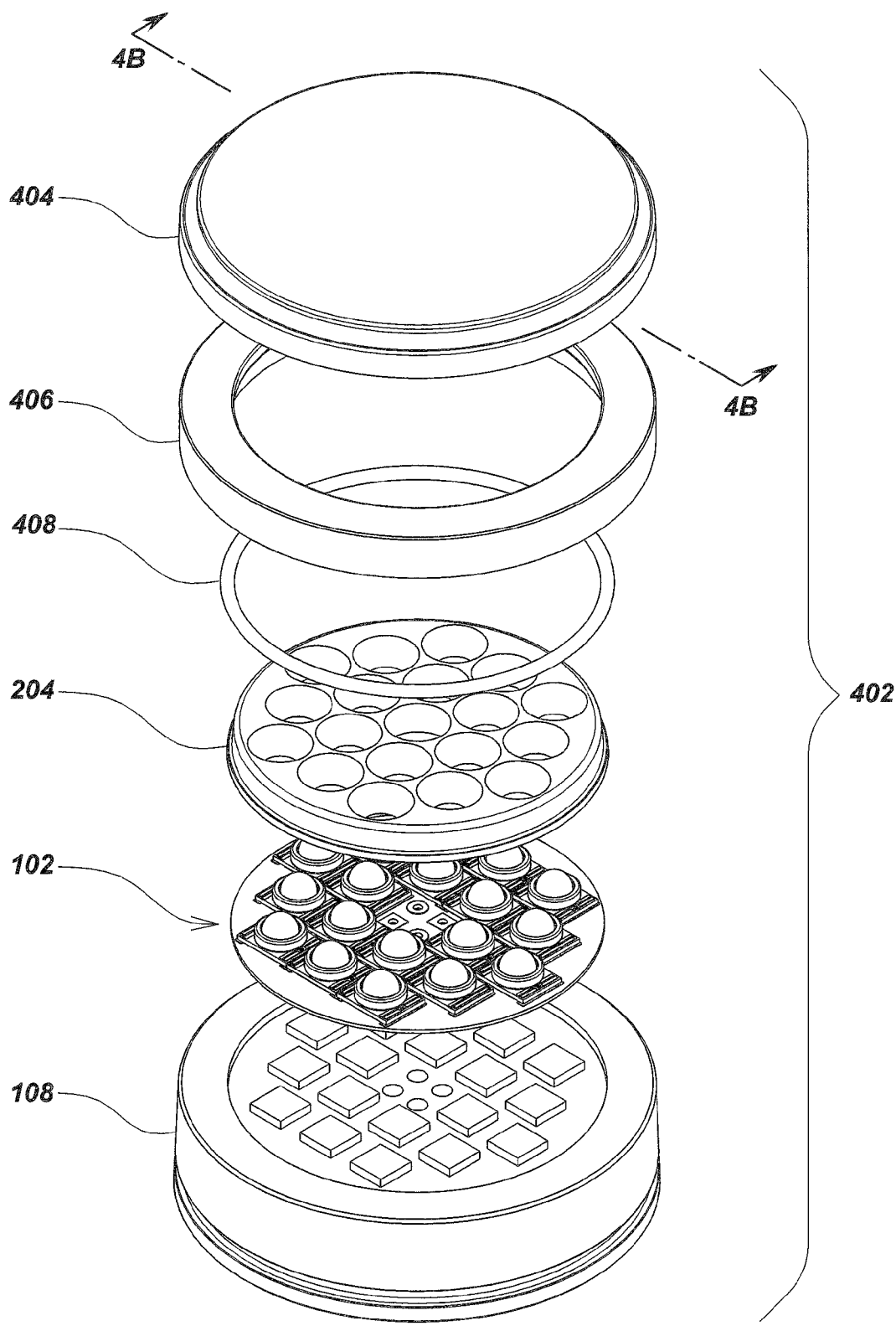
FIG. 4A

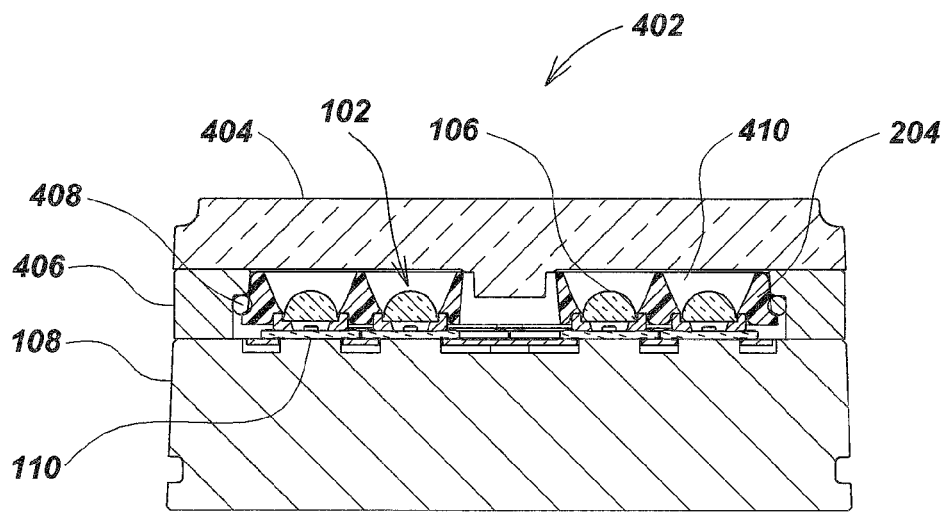
FIG. 4B
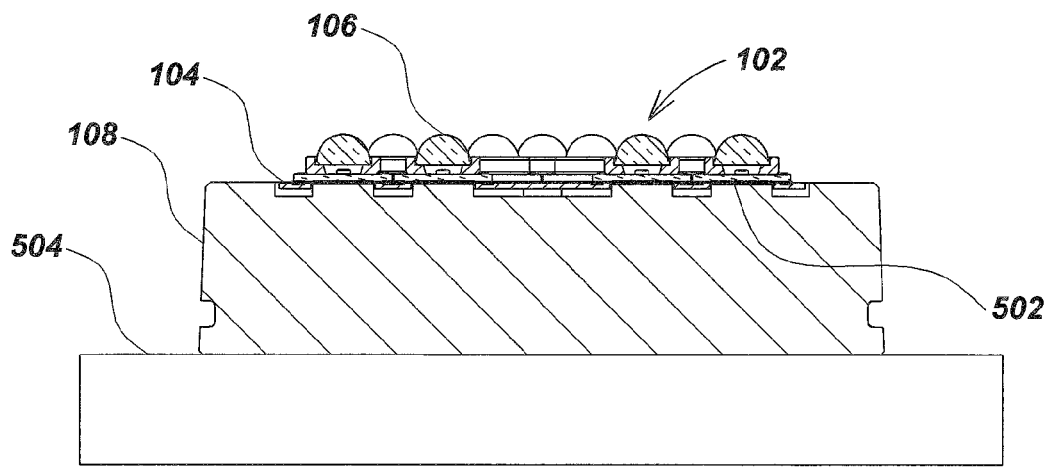
FIG. 5

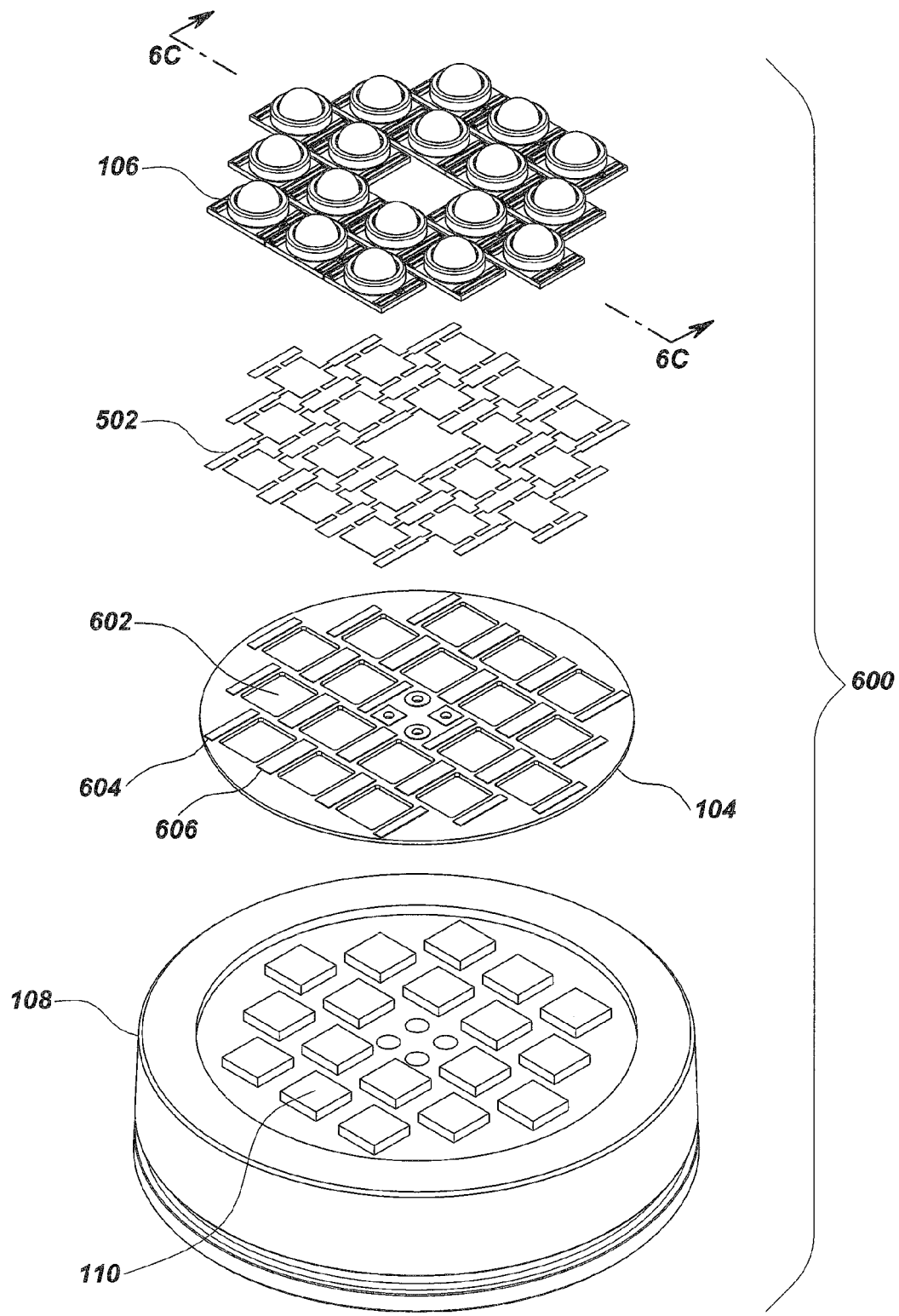
FIG. 6A

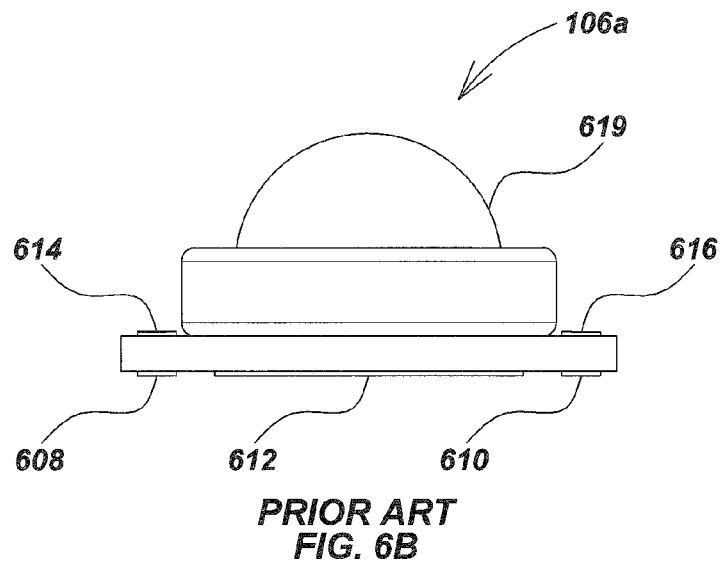
PRIOR ART
FIG. 6B
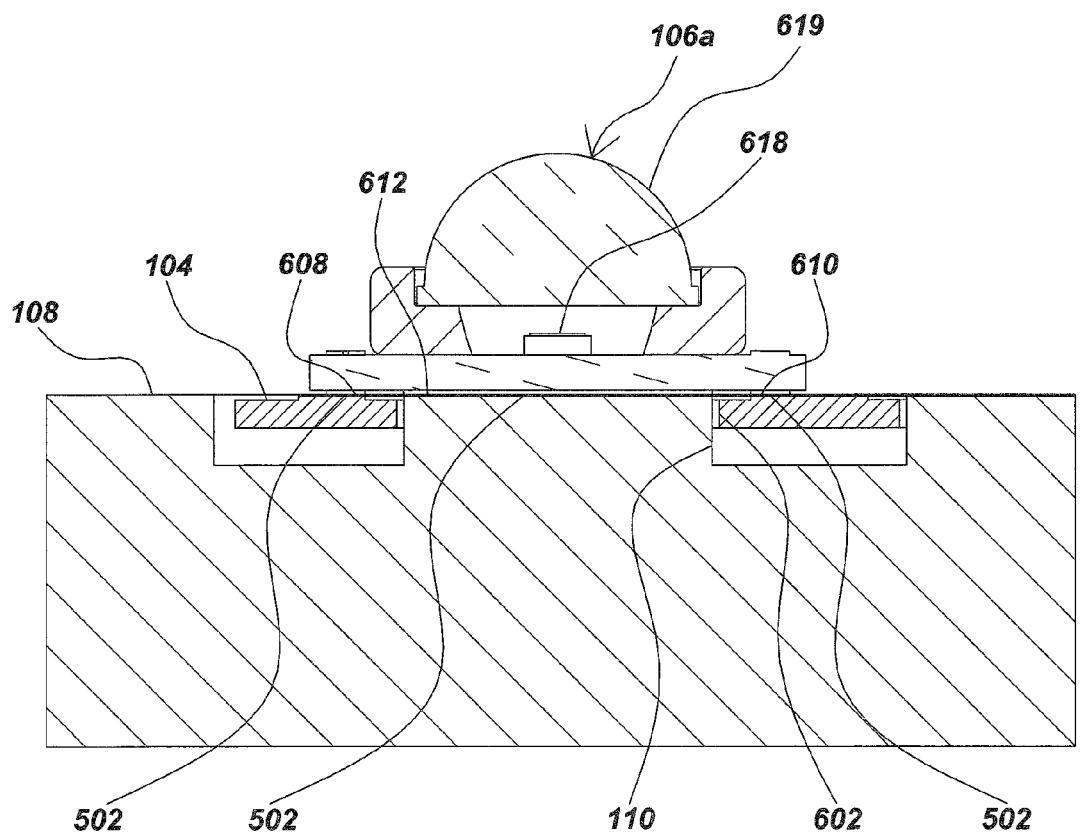
FIG. 6C

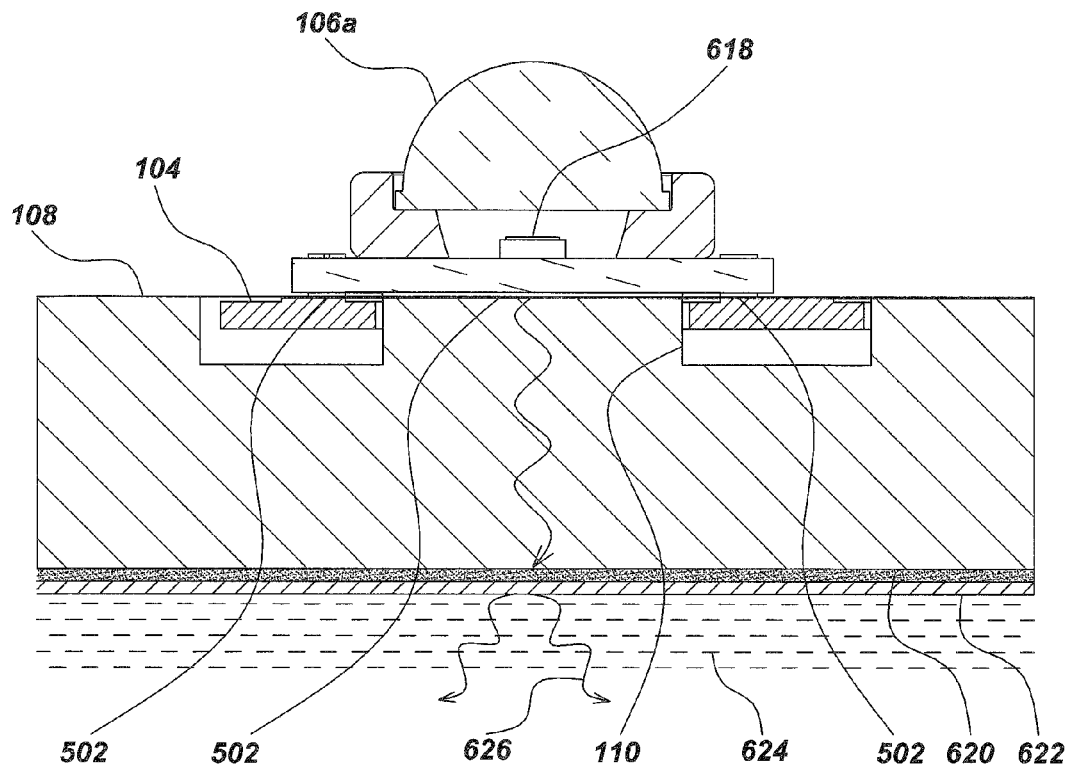
FIG. 6D
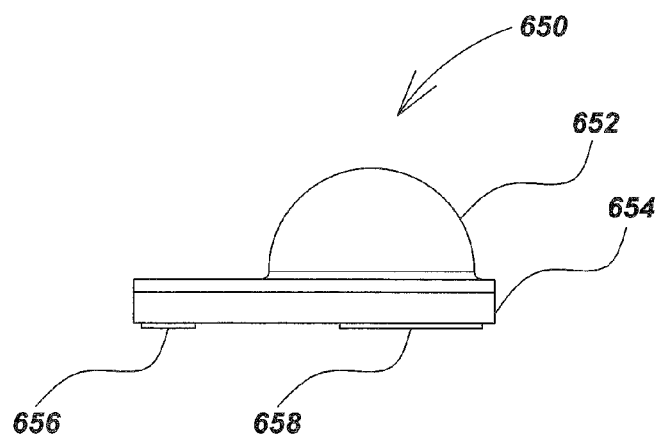
PRIOR ART
FIG. 6E

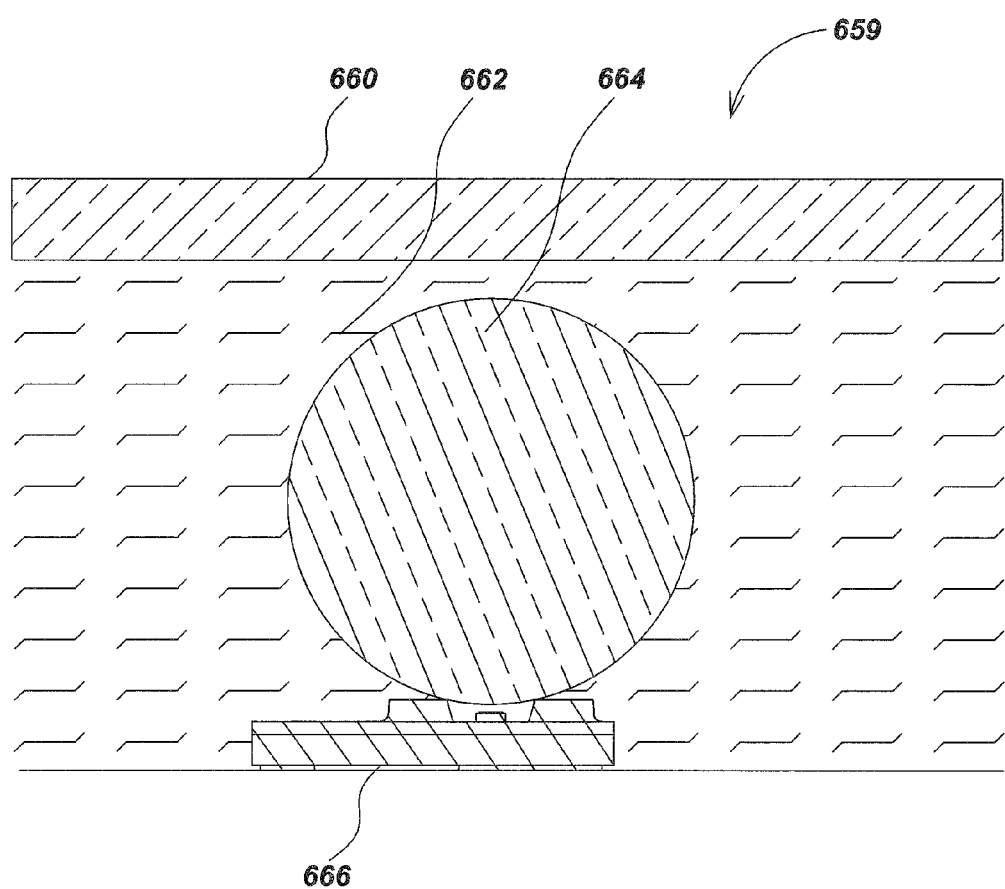
FIG. 6F

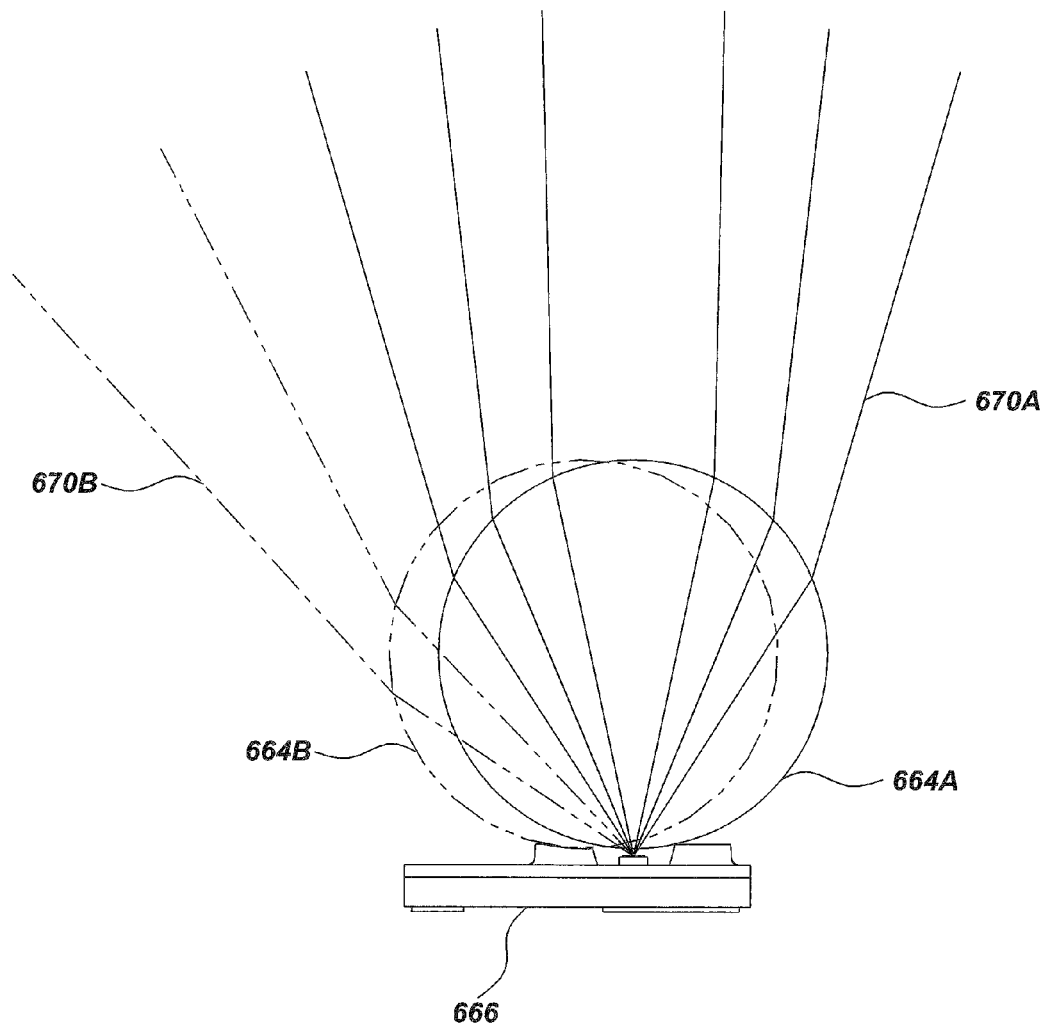
FIG. 6G

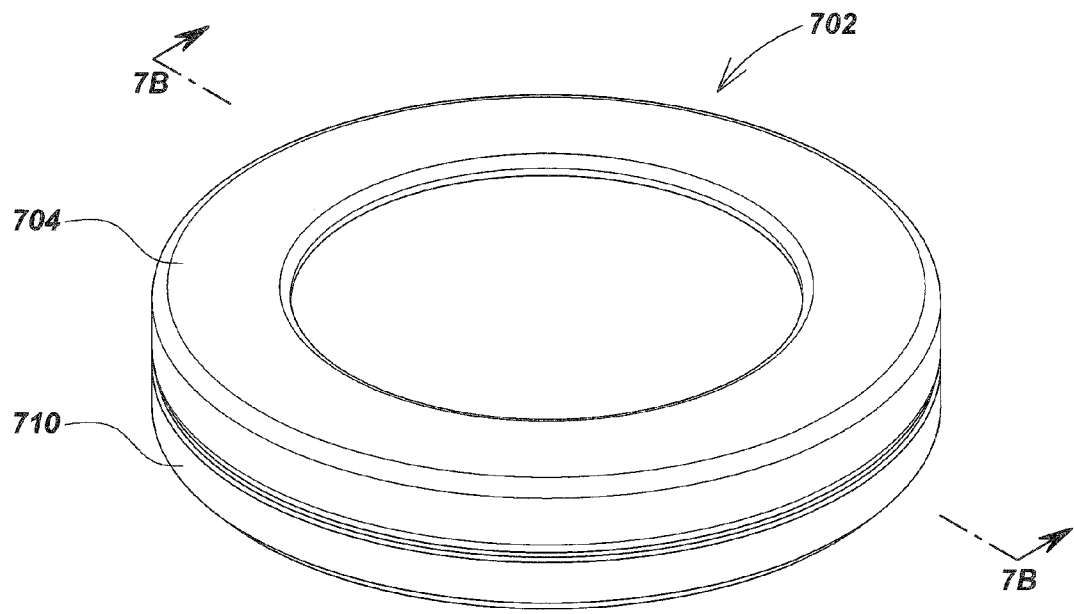
FIG. 7A
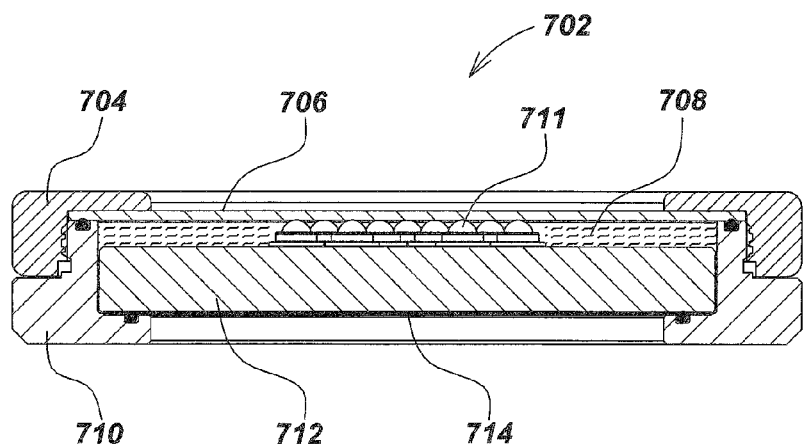
FIG. 7B

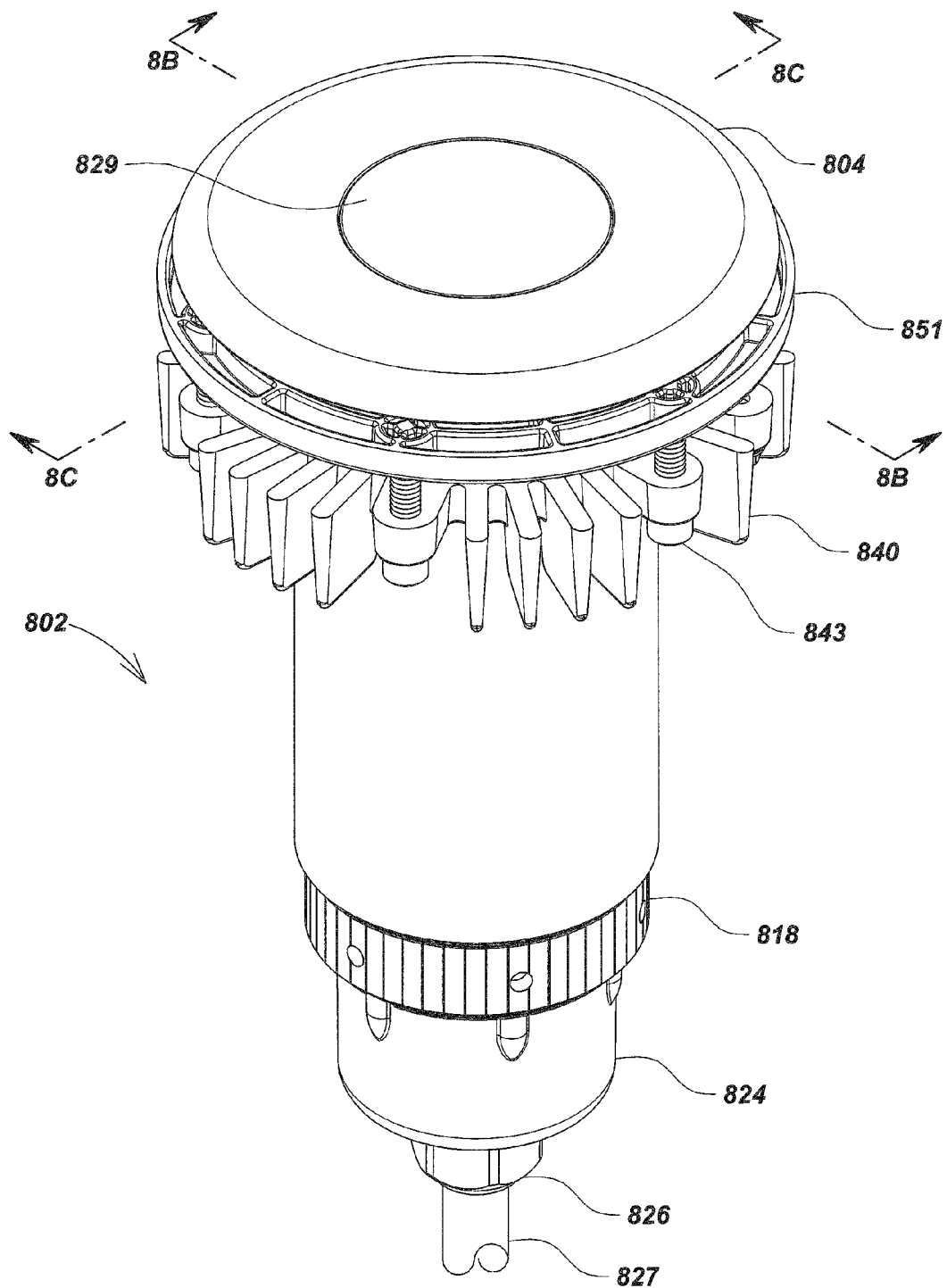
FIG. 8A

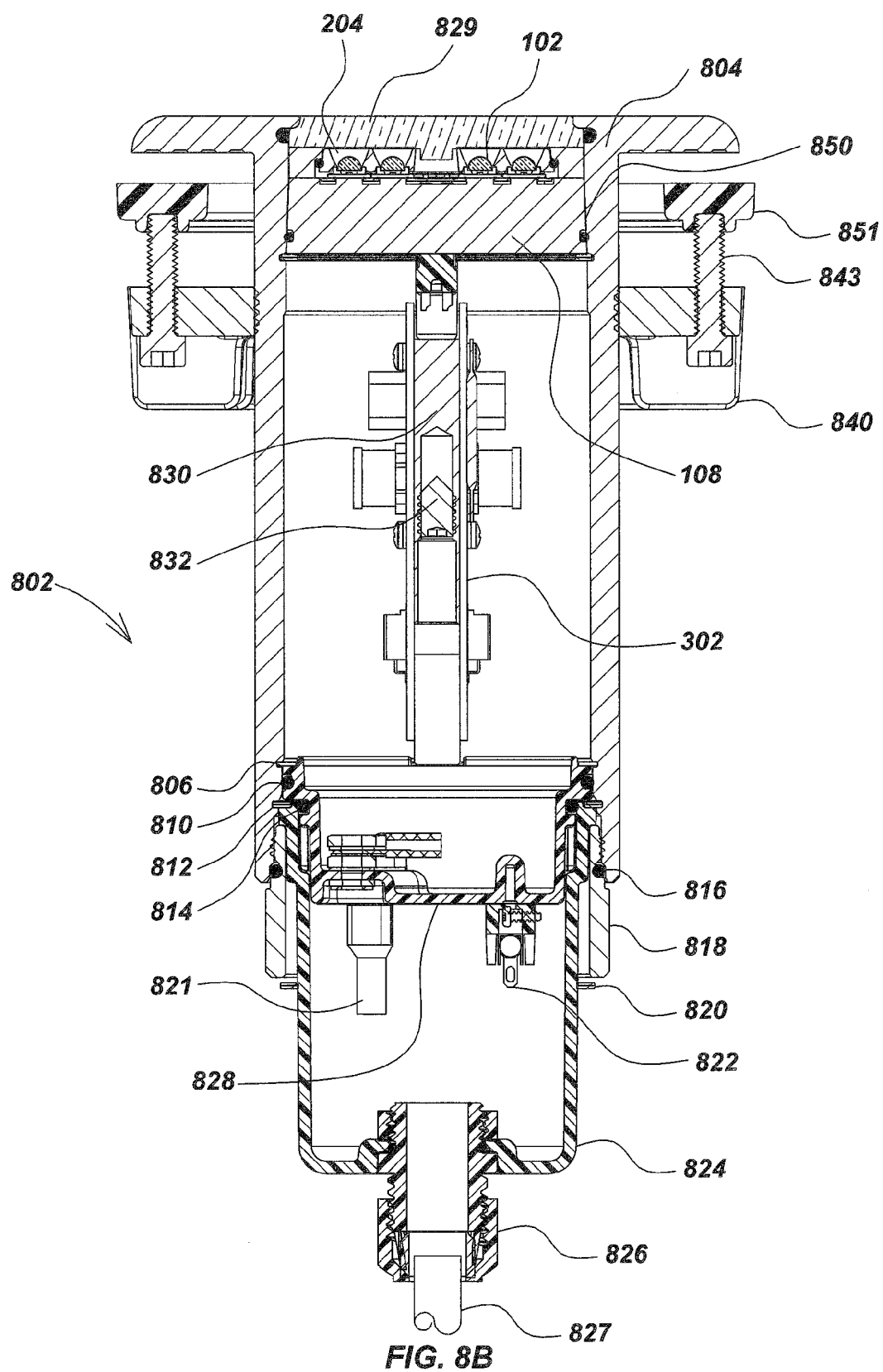
FIG. 8B

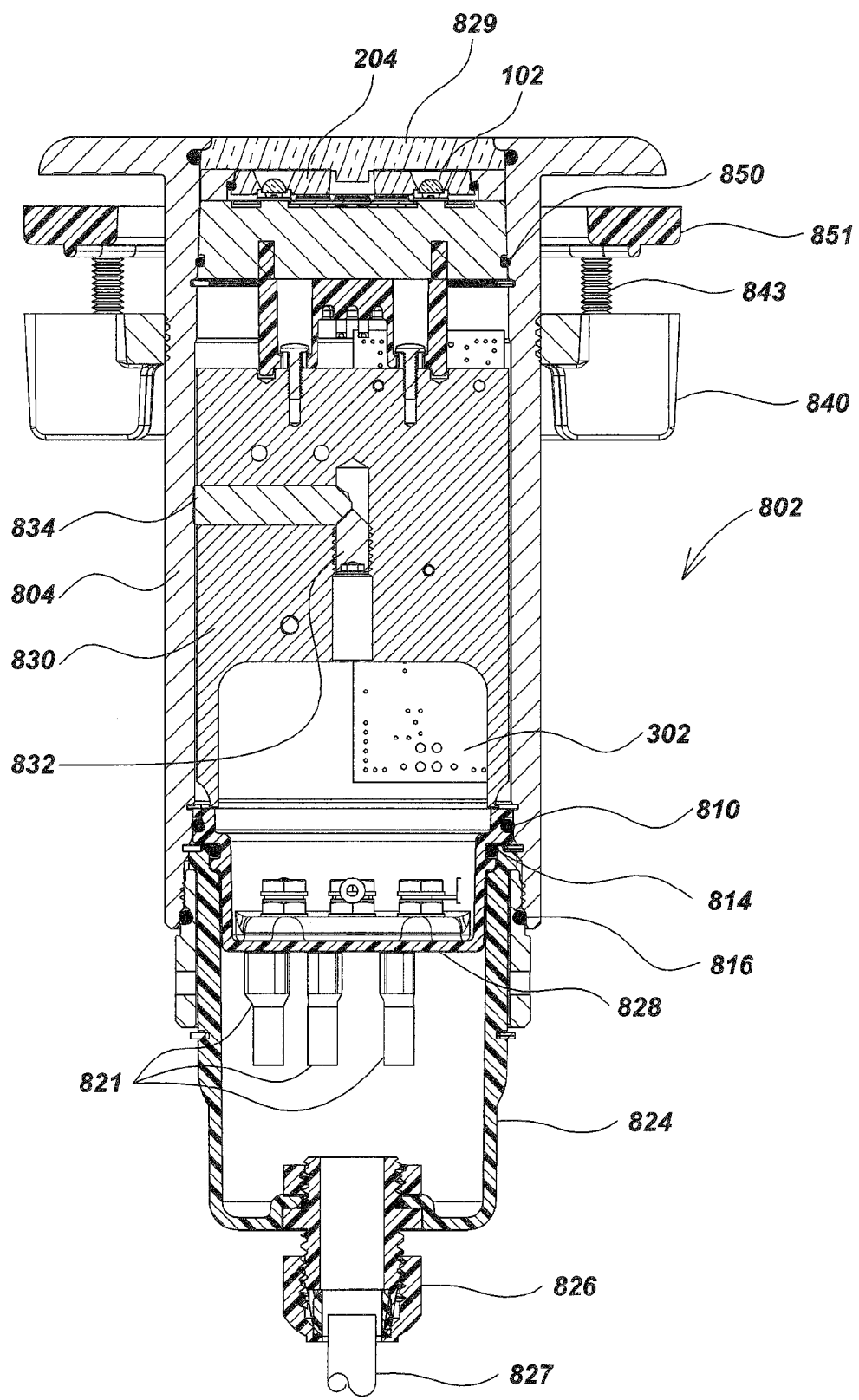
FIG. 8C

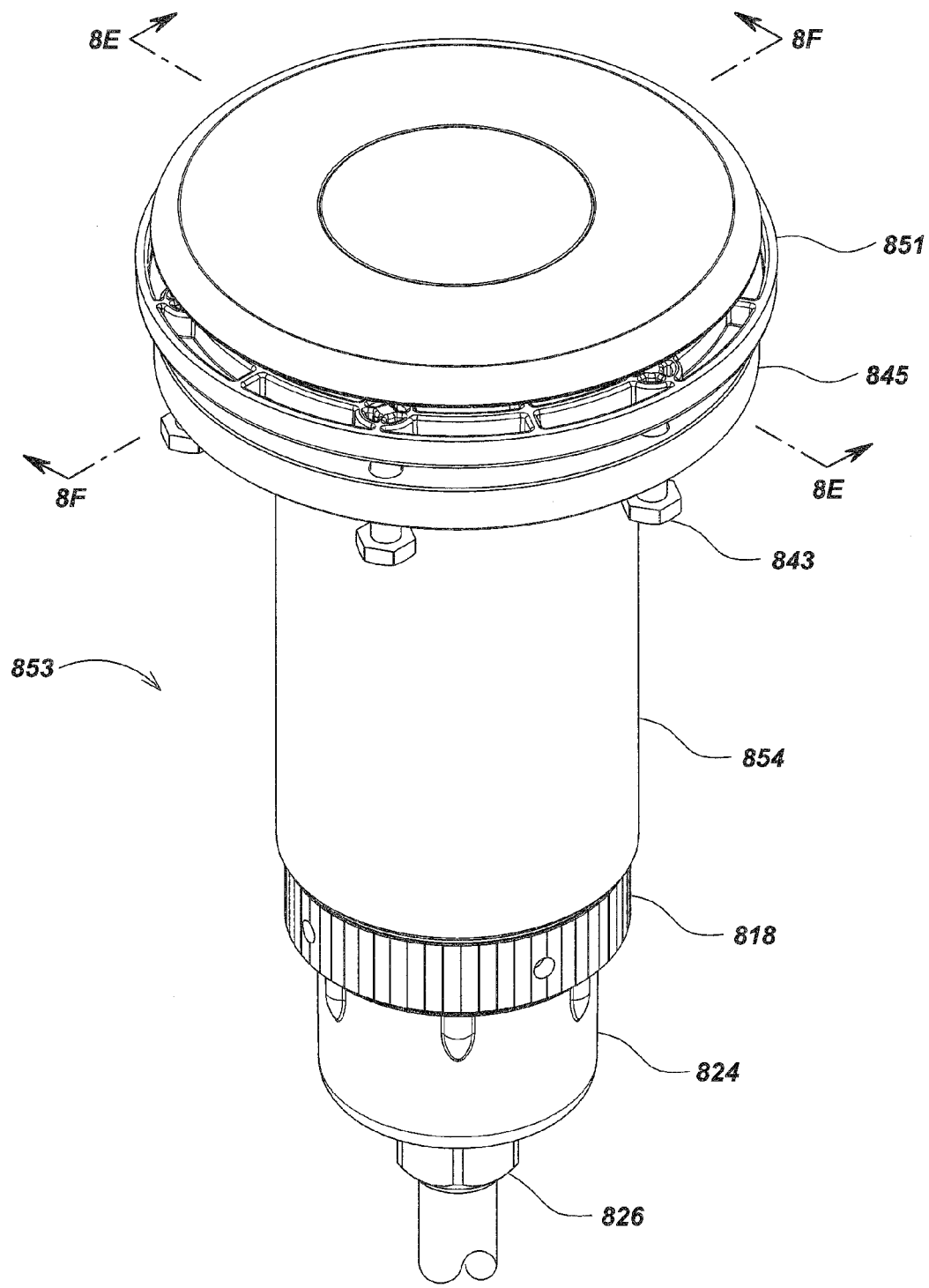
FIG. 8D

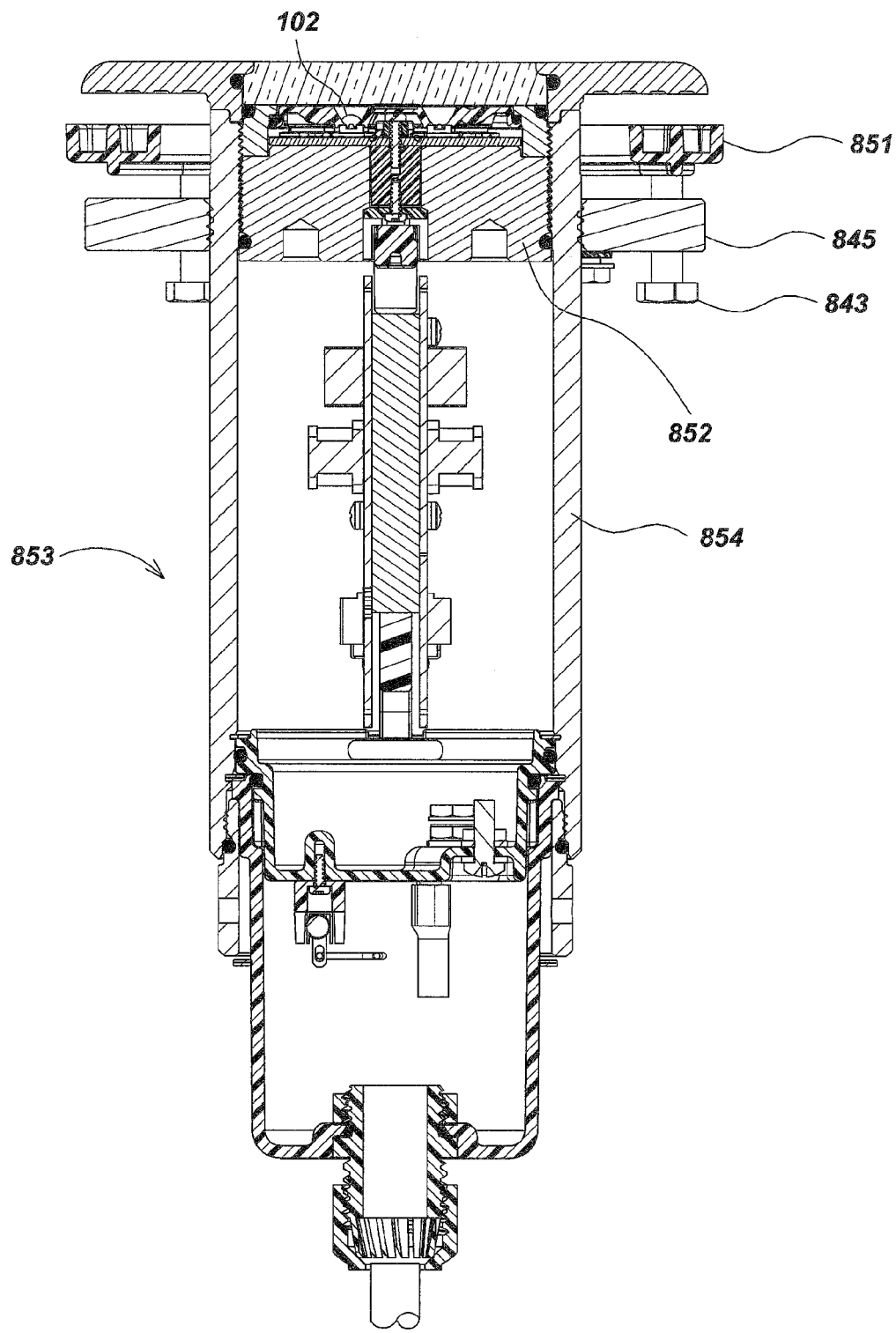
FIG. 8E

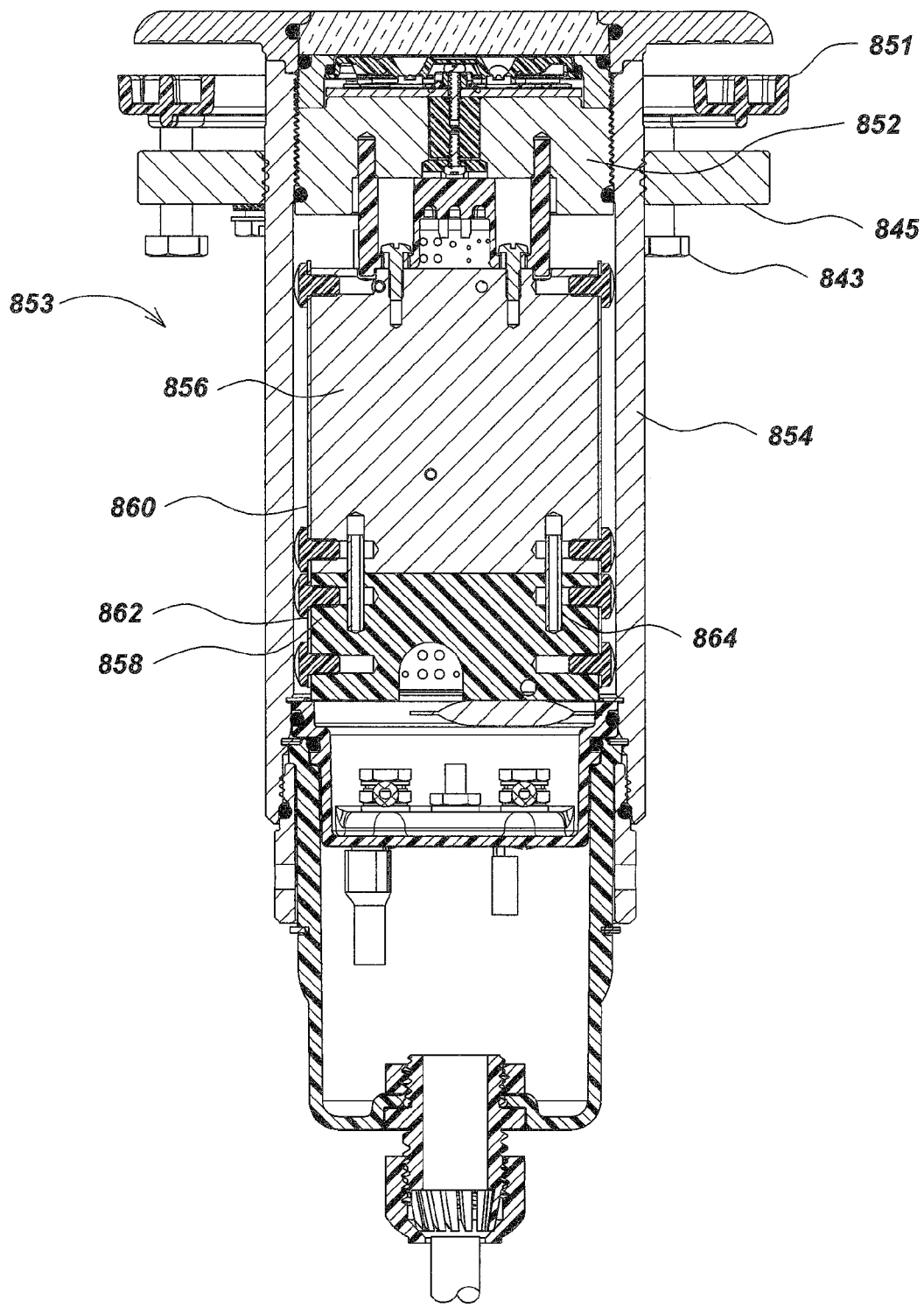
FIG. 8F

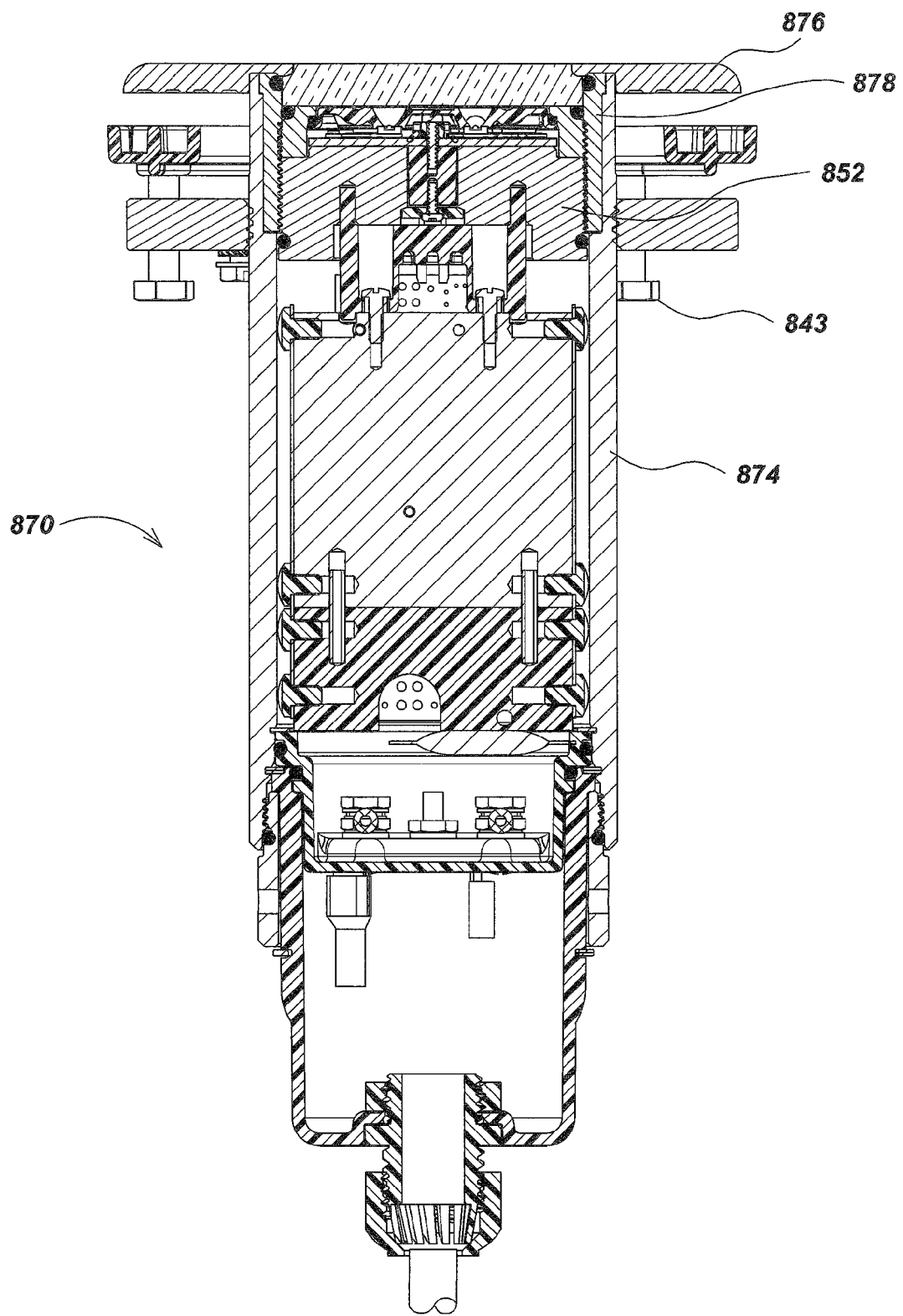
FIG. 8G

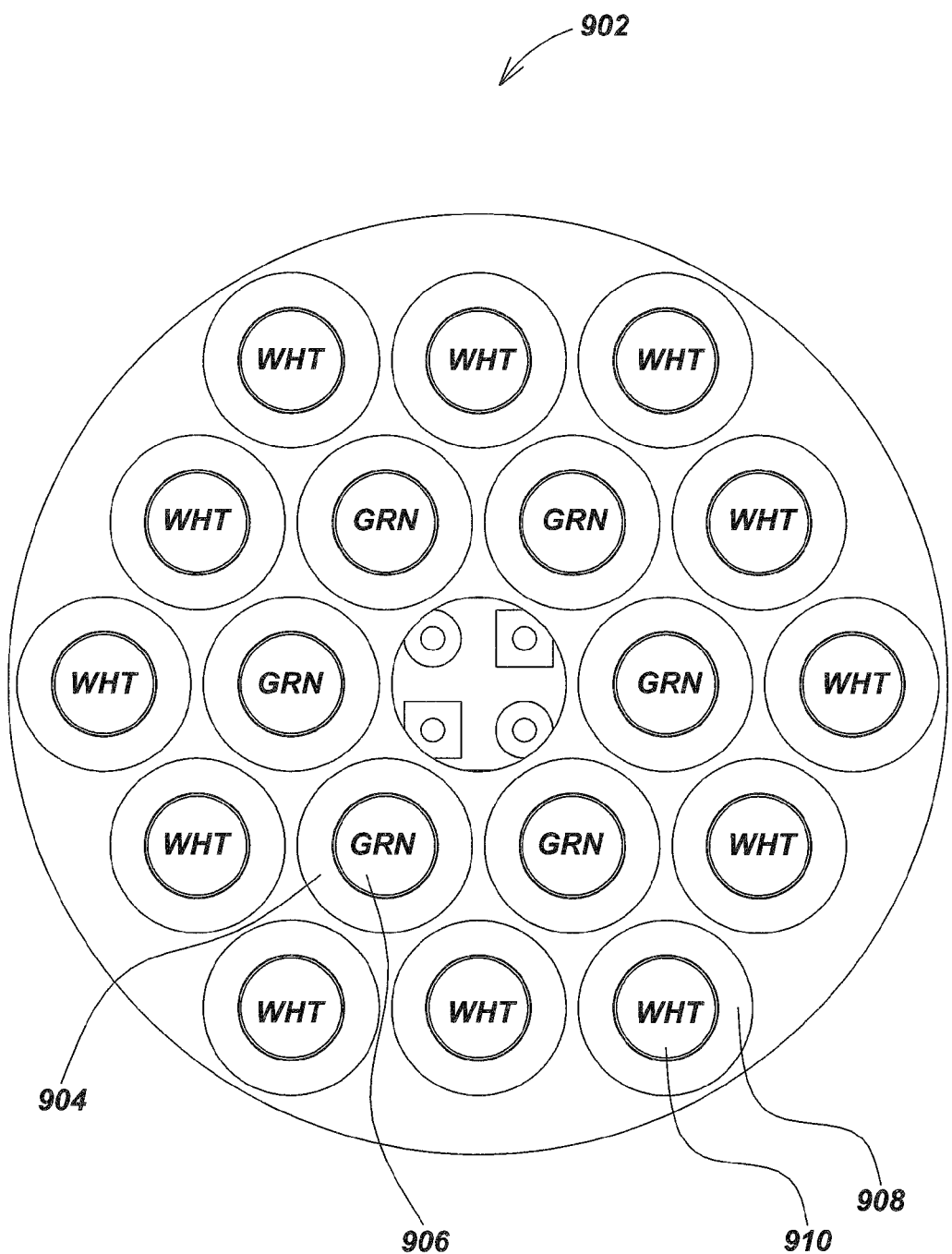
*FIG. 9A*

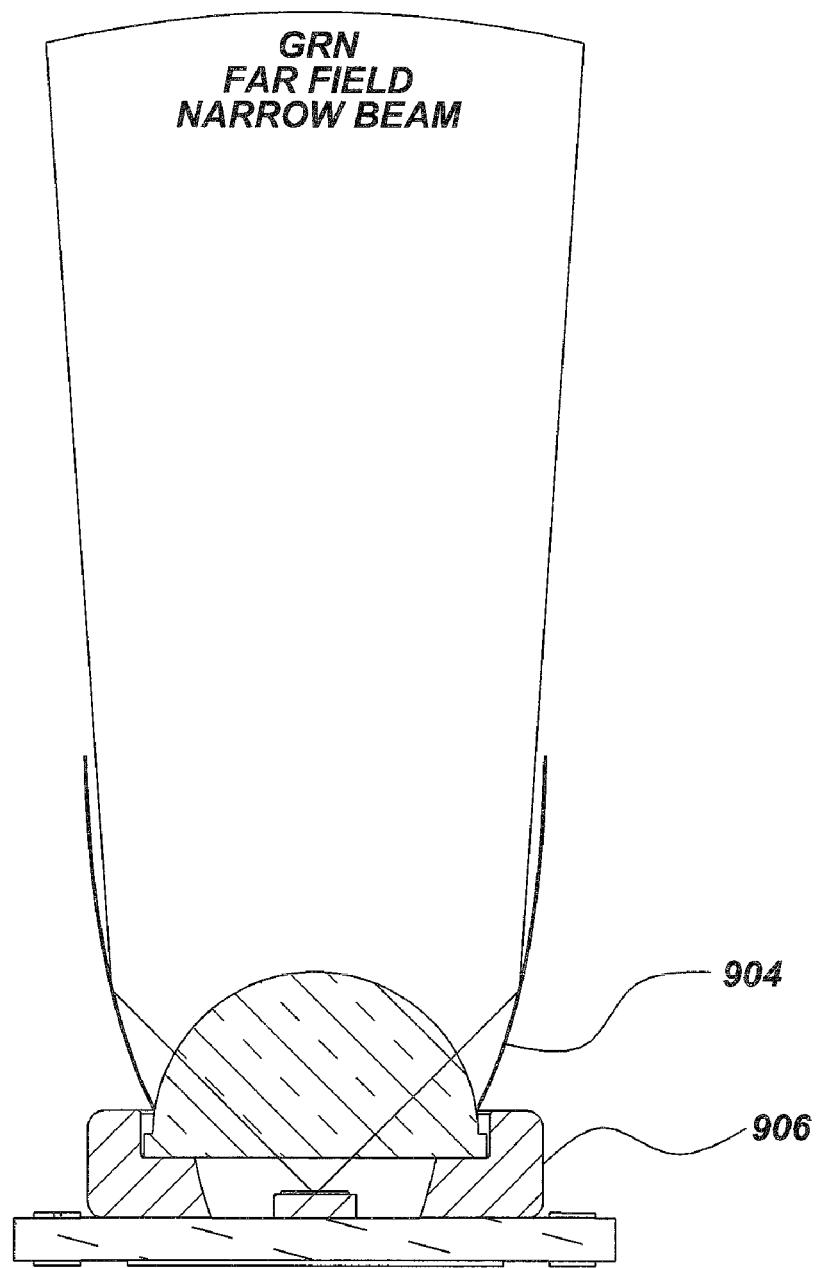
FIG. 9B

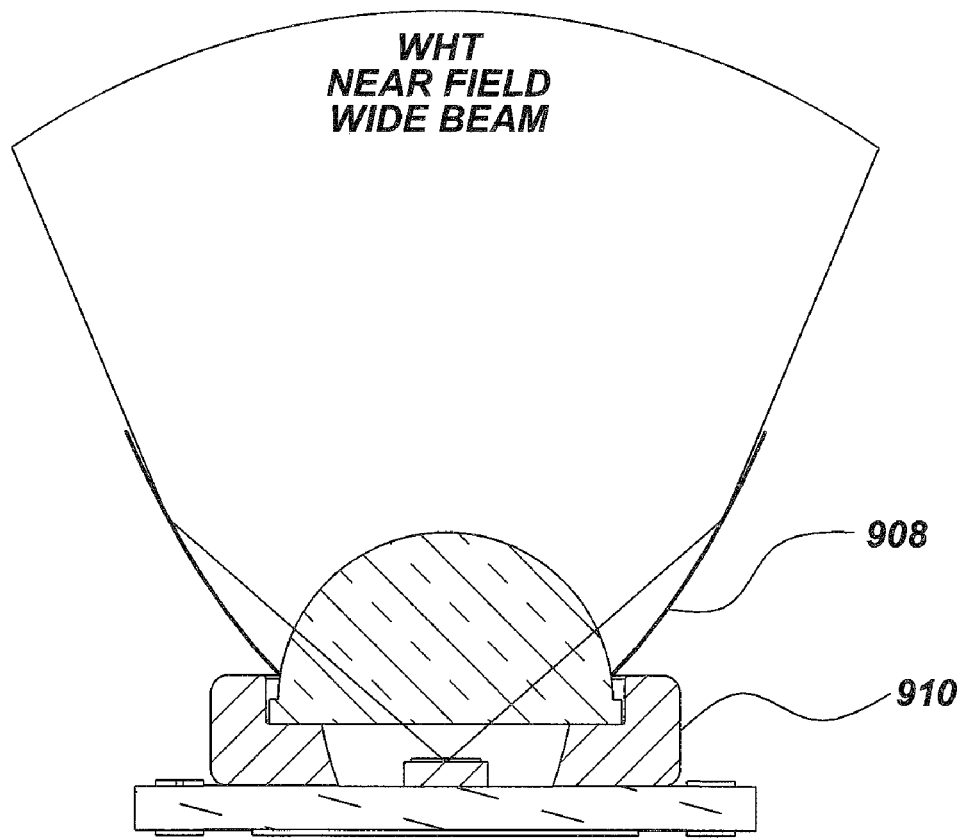
FIG. 9C

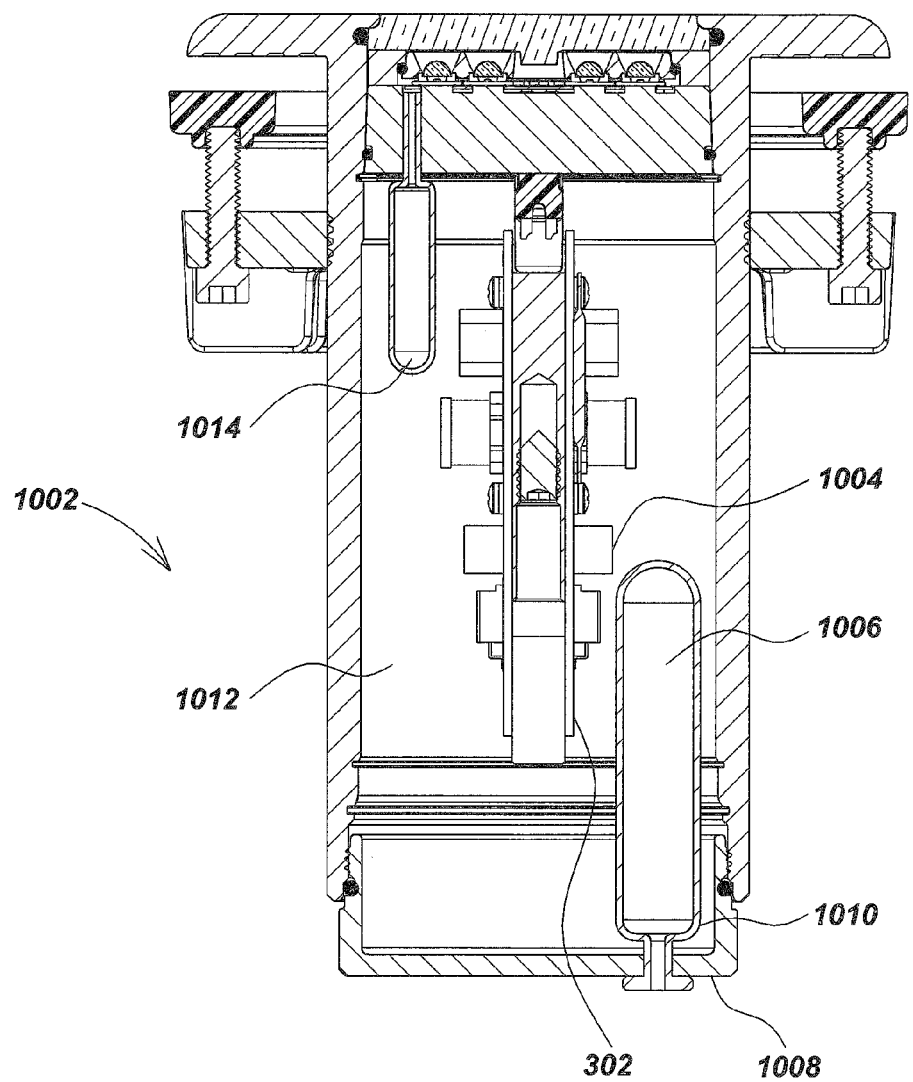
FIG. 10

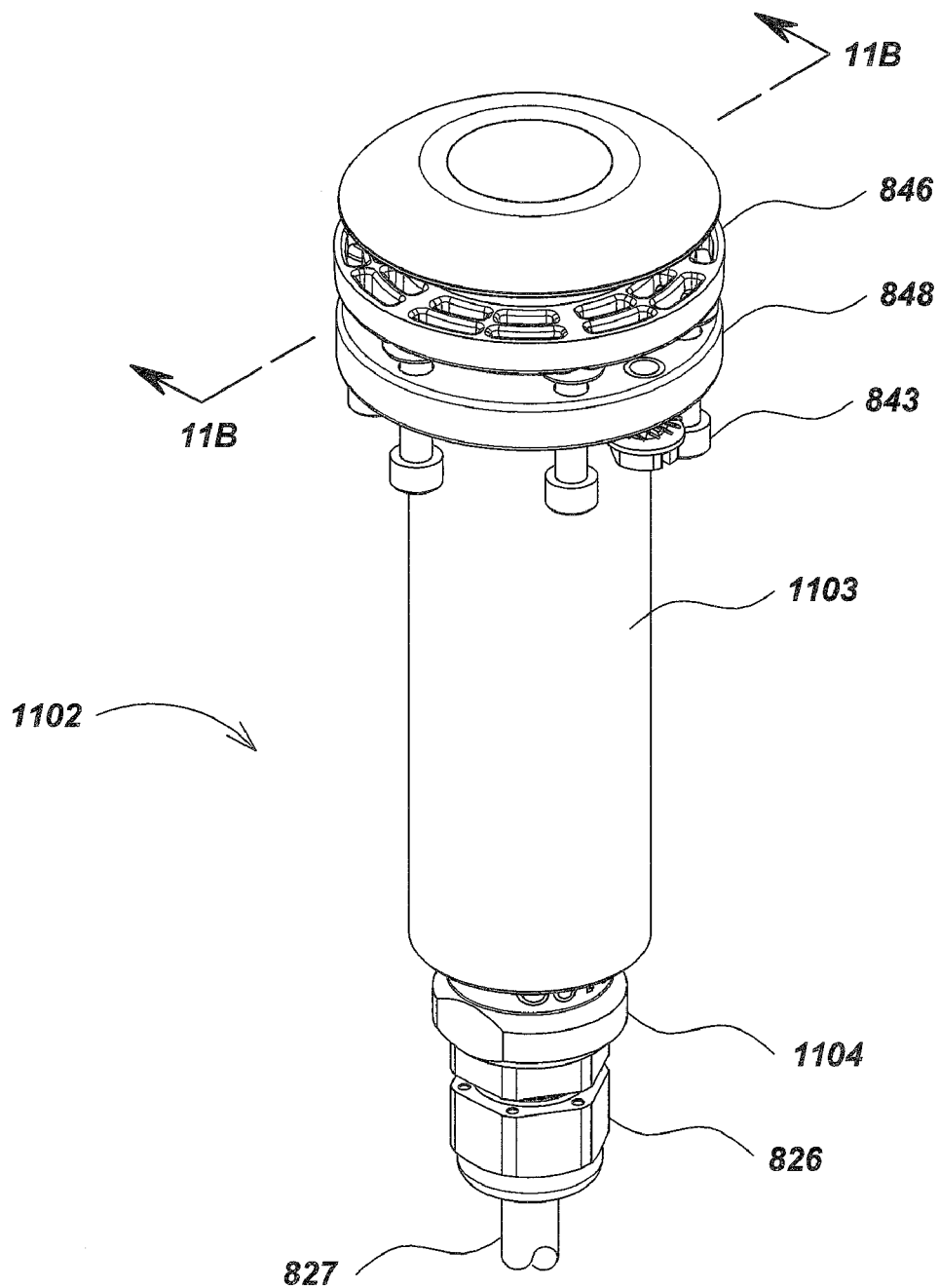
FIG. 11A

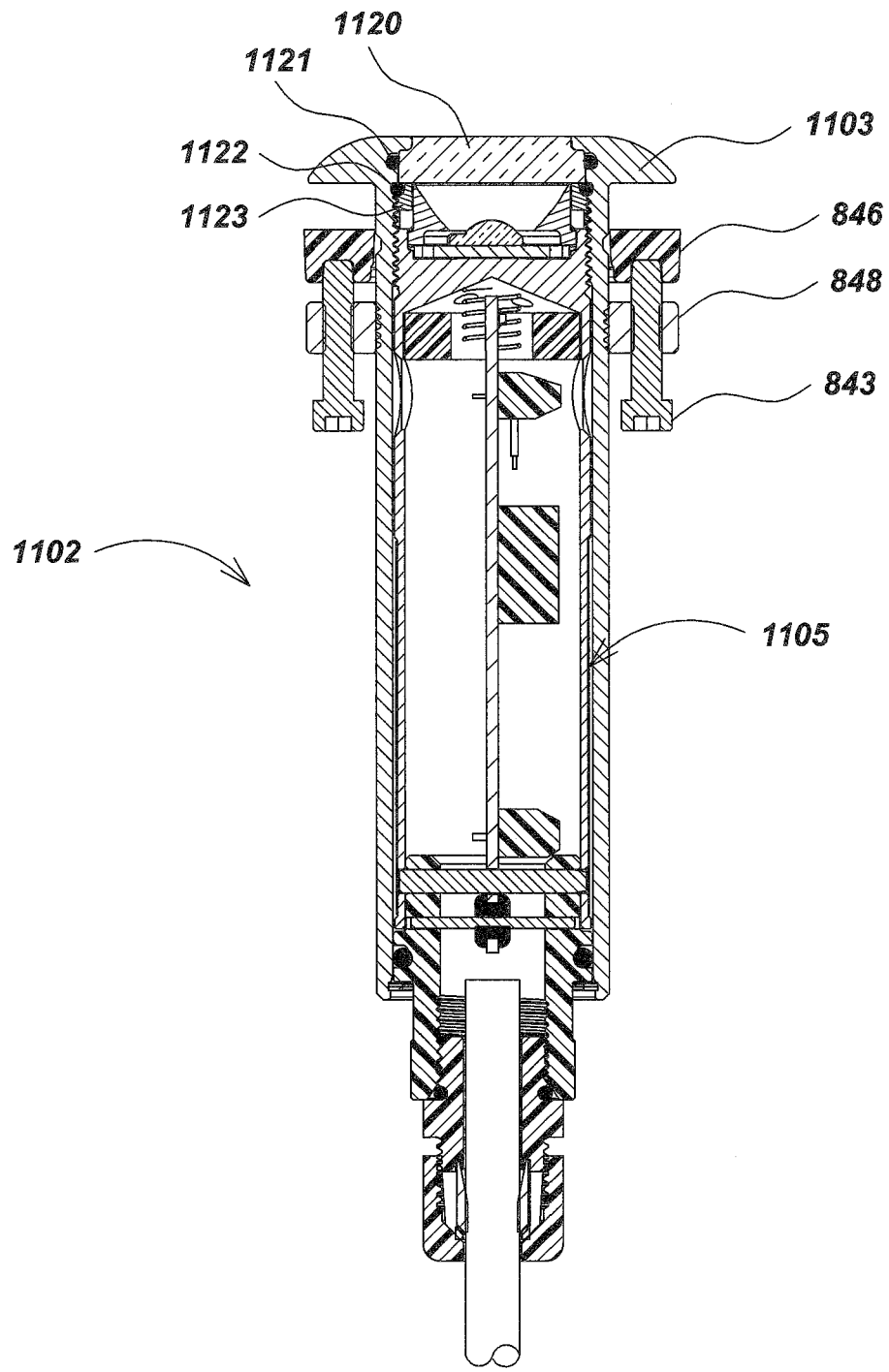
FIG. 11B

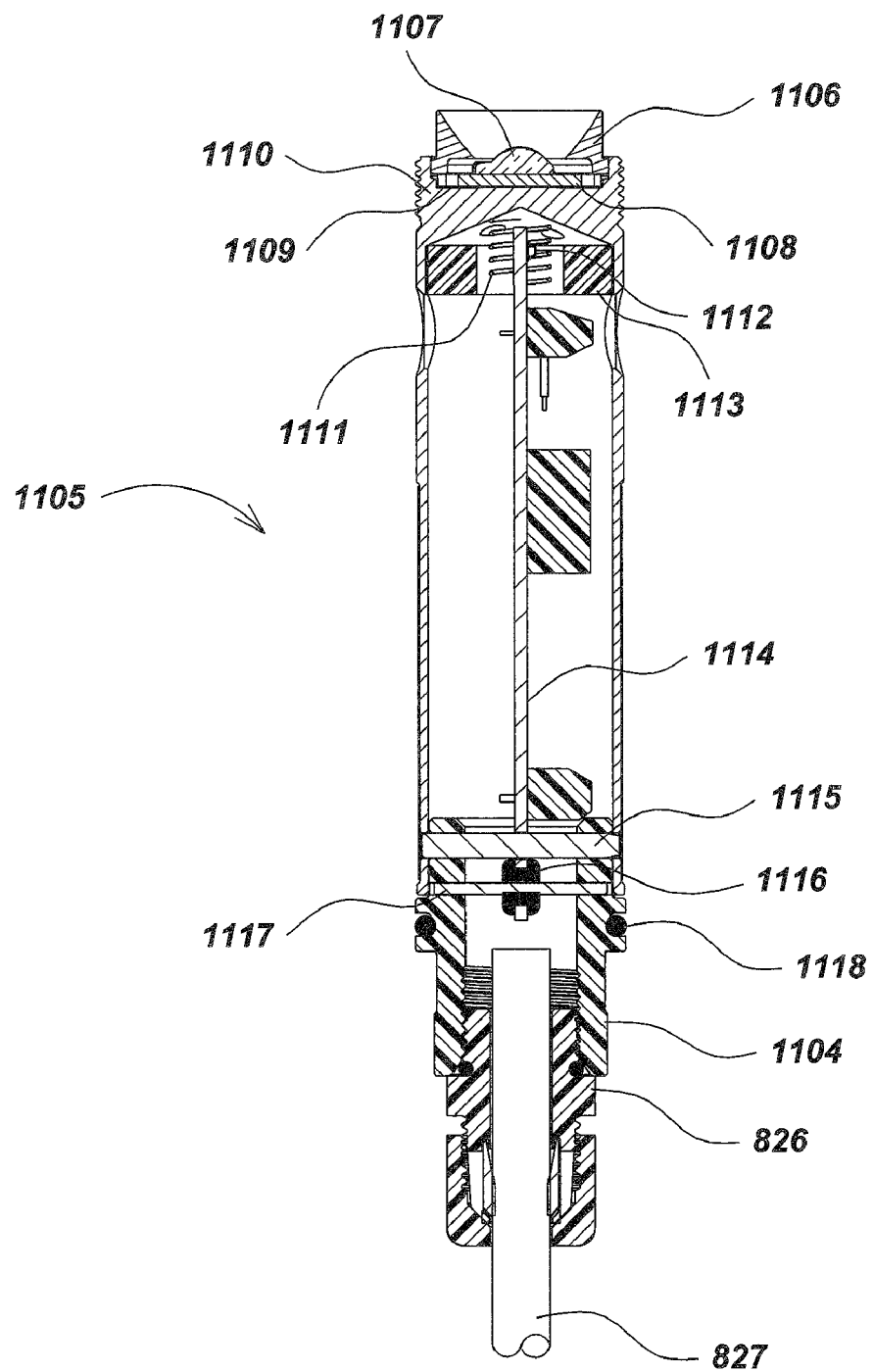
FIG. 11C

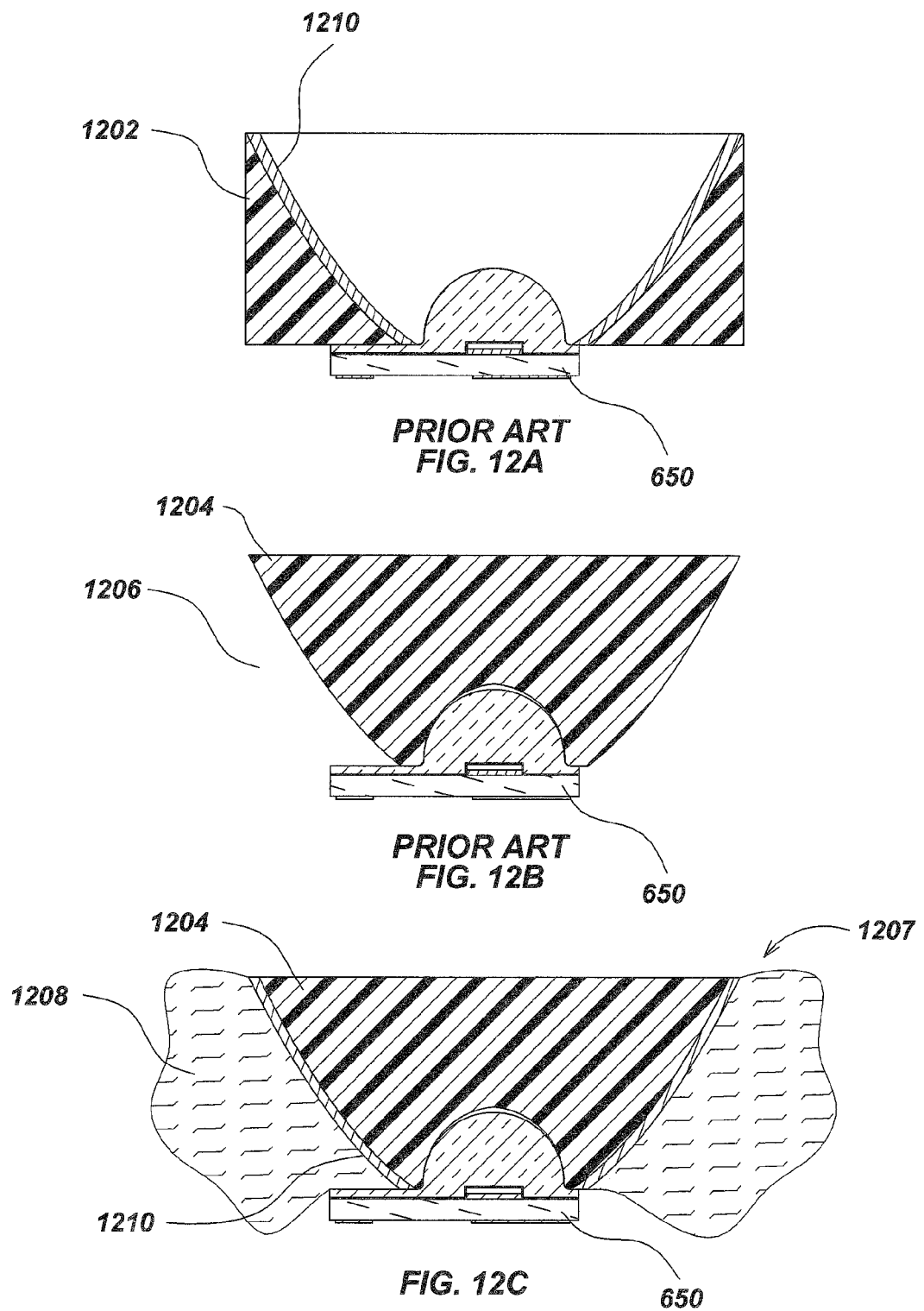
PRIOR ART
FIG. 12A
PRIOR ART
FIG. 12B
FIG. 12C

SUBMERSIBLE MULTI-COLOR LED ILLUMINATION SYSTEM

CROSS-REFERENCE TO RELATED APPLICATION

This application is a division of U.S. patent application Ser. No. 12/036,178 filed Feb. 22, 2008 now abandoned, entitled "LED Illumination System and Methods of Fabrication," which claims priority from U.S. Provisional Patent Application Ser. No. 60/891,463 of Mark S. Olsson et al. filed Feb. 23, 2007 entitled "LED Illumination System and Methods of Fabrication," the entire disclosure of which is hereby incorporated by reference.

FIELD OF THE INVENTION

The present invention relates to devices for illumination using light-emitting diodes (LEDs) as light sources, including systems used in through-hull, marine, outdoor, landscape, pool, fountain, underwater, and pipeline/sewer inspection environments.

BACKGROUND

Semiconductor LEDs have replaced conventional incandescent, fluorescent and halogen light sources in many applications due to their small size, reliability, relatively inexpensive cost, long life and compatibility with other solid state devices. In a conventional LED, an N-type gallium arsenide substrate that is properly doped and joined with a P-type anode will emit light in visible and infrared wavelengths under a forward bias. In general, the brightness of the light given off by an LED is contingent upon the number of photons that are released by the recombination of carriers inside the LED. The higher the forward bias voltage, the larger the current and the larger the number of carriers that recombine. Therefore, the brightness of an LED can be increased by increasing the forward voltage. However due to many limitations, including the ability to dissipate heat, until recently, conventional LEDs have only been capable of producing about six to seven lumens.

Recently, advanced LEDs have been developed which demonstrate higher luminosity, lower power and heat profiles, and smaller footprints enabling the use of multiple LEDs in composite lighting structures. The Cree X-Lamp XR-E, as an example, can produce 136 lumens of luminous flux at 700 mA, with a forward voltage of 3.5V. Its thermal design provides a ratio between the resistance junction and ambient temperature of as low as 13° C./W at maximum current. It provides a small footprint (4.3×7.0×9 mm). They are also reflow-solderable, using a thermal ramp scheme with a 260° C. maximum, enabling certain applications germane to the present invention. Comparable competitive LED products are only slightly behind in market introduction, such as Seoul's Star LED and Luxeon's "Rebel" High Power LEDs.

Such LEDs offer increased brightness over conventional LEDs, and reduce power requirements, but may still suffer from problems associated with heat dissipation and inefficient distribution of light for certain applications. While high-power LEDs, which are a relatively young branch of LED technology, are significantly more efficient than incandescent lights or gas-filled (halogen or fluorescent) lights, they still dissipate on the order of 50% of their energy in heat. If this heat is not managed, it can induce thermal-runaway conditions in the LED, resulting in its failure. Thus, heat management is a critical issue for new applications seeking to take advantage of the efficiencies of LEDs as a source of illumination. For situations requiring high levels of light, this situation is aggravated by the requirement of combining many LEDs in a composite light-source structure.

In marine applications in particular, the use of LEDs as light sources has had limited success to date, awaiting improved efficacy and heat management techniques. Other considerations governing the application of LEDs for marine lighting include the requirement to use wavelengths of light in the range from ~450 nm to ~600 nm—blue to green-yellow—for better penetration in a marine underwater environment.

SUMMARY OF THE INVENTION

The presently claimed invention relates generally to lighting systems, such as may be used underwater. In one aspect, the invention relates to a submersible LED illumination system including an array of LEDs. A first portion of the LEDs may be capable of emitting white light and a second portion of the LEDs may be capable of emitting light of a single color. The system may further includes a plurality of reflectors, each reflector surrounding a corresponding one of the LEDs. A first portion of the reflectors may be configured to provide a far field relatively narrow beam of illumination and a second portion of the reflectors may be configured to provide a near field relatively wide beam of illumination. A housing may enclose the array of LEDs and the reflectors. A transparent window may be disposed in the housing and extend across the array of LED. A optically transparent material may be disposed between the array of LEDs and the window. A seal may be located between the window and the housing.

BRIEF DESCRIPTION OF THE DRAWINGS

FIG. 1A is an exploded isometric view of an array of LEDs combined with a printed circuit board in an assembly aligned for placement over a housing component.

FIG. 1B is a vertical sectional view of the LED assembly of FIG. 1A, illustrating further details of its heat-sink, bonding area, printed circuit board (PCB) and LEDs.

FIG. 2A is an exploded isometric view of a similar LED assembly with the addition of a separate reflector component aligned above the LEDs and PCB so that the LEDs protrude through openings in the reflector component.

FIG. 2B is a top plan view of the assembly of FIG. 2A illustrating the LEDs surrounded by their corresponding mini-reflectors.

FIG. 2C is a vertical sectional view of the assembly of FIG. 2B, illustrating the placement of the thermal transfer pads of the individual LEDs to enable the migration of heat to the heat-sink.

FIG. 3 is a vertical sectional view of another embodiment of the present invention in the form of a through-hull LED illumination system.

FIG. 4A is an exploded isometric view of an LED illumination fixture suitable for marine applications.

FIG. 4B is a vertical sectional view of the fixture of FIG. 4A.

FIG. 5 is a vertical sectional view of an LED assembly mounted on a heating block.

FIG. 6A is an exploded isometric view illustrating the LED assembly of FIG. 5 after the insertion of a solder pre-form between the LED array and the PCB.

FIG. 6B is a side elevation view of an LED illustrating its electrical contacts and thermal contact pad.

FIG. 6C is vertical sectional view of the LED assembly of FIG. 6B after attachment to a heat-sink, and illustrating mesa contact pads and a protective cover.

FIG. 6D is a view similar to FIG. 6C diagrammatically illustrating the use of the thermal conductivity of the heat sink to drain heat from the LEDs and the use of an anti-corrosive barrier layer.

FIG. 6E illustrates a Luxeon Rebel LED.

FIG. 6F illustrates an alternate embodiment of an LED illumination system in which the LED light emission is steered using a transparent, refractive Cubic Zirconia sphere as a lens.

FIG. 6G illustrates a means of dynamically steering a light beam of an LED.

FIG. 7A is an isometric view of an outer casing of another embodiment of the present invention suited for underwater use.

FIG. 7B is a vertical sectional side view of the embodiment of FIG. 7A.

FIG. 8A is an isometric view of an embodiment of the present invention in the form of a thru-hull LED illumination system.

FIG. 8B is a vertical sectional view taken along line 8B-8B of FIG. 8A illustrating details of the LED illumination system of FIG. 8A.

FIG. 8C is a vertical sectional view taken along line 8C-8C of FIG. 8A illustrating further details of the LED illumination system of FIG. 8A.

FIG. 8D is an isometric view of an alternate embodiment of the thru-hull LED illumination system that incorporates a simplified jacking ring without heat sink fins.

FIG. 8E is a vertical sectional view taken along line 8E-8E of FIG. 8D illustrating details of the LED illumination system of FIG. 8D.

FIG. 8F is a vertical sectional view taken along line 8F-8F of FIG. 8D illustrating further details of the LED illumination system of FIG. 8D.

FIG. 8G is a vertical sectional view similar to FIG. 8F illustrating details of an alternate thru-hull LED illumination system.

FIG. 9A illustrates an LED lighting system in which combinations of closely adjacent LEDs having different wavelength emissions are located in an array with their reflectors set at differing angles and diameters.

FIG. 9B is a vertical sectional view of an LED assembly diagrammatically illustrating the manner in which the far field can be illuminated by light closer to the green wavelength (around 550 nanometers) in a narrow beam, in order to provide deeper penetration in a marine environment.

FIG. 9C is a vertical sectional view of an LED assembly diagrammatically illustrating the white-light component of an LED assembly, and the near field of vision illuminated by wider-beam white light.

FIG. 10 is a vertical sectional view illustrating an embodiment of a thru-hull LED illumination system adapted for deep-water applications.

FIG. 11A is an isometric view of a miniature thru-hull LED illumination system.

FIG. 11B is a vertical sectional view taken along line 11B-11B of FIG. 11A illustrating its interchangeable light cartridge.

FIG. 11C is a vertical sectional view illustrating further details of the interchangeable light cartridge.

FIG. 12A is a vertical sectional view illustrating the conventional manner of mounting an LED adjacent a metalized reflector FIG. 12B is a vertical sectional view illustrating the conventional manner of mounting an LED adjacent a total internal reflective (TIR) lens.

FIG. 12C is a vertical sectional view illustrating the mounting an LED adjacent a plastic lens with a metalized exterior for immersion in a pressure compensating fluid or gel.

Throughout the drawing Figs. like reference numerals refer to like parts.

DETAILED DESCRIPTION

According to one embodiment of the invention, multiple LEDs may be soldered directly to a massive heat-sink, enabling the use of more LEDs in a smaller space, producing more powerful lighting, using low-temperature bonding techniques.

In accordance with another embodiment of the present invention, multiple LEDs may be soldered directly to a Metal Core Printed Circuit Board (MCPCB), and then attached to a massive heat sink using screws and spring washers to provide uniform loading. A thermally conductive, electrically isolating compound forms the interface between the MCPCB and the heatsink. The heatsink may be anodized aluminum, providing a secondary electrical insulating barrier with small thermal penalty.

In accordance with another embodiment of the present invention, multiple LED sources are mounted together using varied reflector curves for LEDs of differing wave-lengths in combination to provide multiple-wave-length lighting from a single unit.

In accordance with another embodiment of the present invention, multiple LED sources are focused using individual reflectors elements, either placed singly on each LED within a centering frame, or molded as a complete assembly.

In accordance with another embodiment of the present invention suited for underwater use, such as in thru-hull applications for example, an optically clear oil, gel or similar fluid fills all otherwise open space between an LED array and a protective window to improve the optical performance of the emitted light by reducing total internal reflection.

In accordance with another embodiment of the present invention, multiple LED sources are focused using individual Total Internal Reflection (TIR) plastic lenses either in air space or immersed in a fluid of appropriate refractive index.

In accordance with another embodiment of the present invention, multiple LED sources are focused using individual metalized reflectors where the volume in front of the LED and inside of the reflector is filled with a clear, high transmissivity plastic material to which the reflective metal coat is applied to the exterior surface.

In accordance with another embodiment of the present invention, an optical gel may be used to optically couple the LED to the lens or clear plastic face piece.

In accordance with another embodiment, multiple closely-packaged LEDs are provided with a pressure-compensated housing constituting a deep-water lighting system with an innovative method of thermal management.

In another application of the present invention, LED-based marine lighting systems may be combined to create novel applications in the fields of deep-ocean observation of hydrocarbons and marine life forms as well as land-based illumination.

In accordance with an embodiment of the present invention, an array of LEDs is combined with a printed circuit board (PCB) in an assembly aligned for placement over a heat sink for thermal management. Mesa structures on the heat sink provide bonding areas for the thermal transfer pads of the individual LEDs in the array. Referring to FIG. 1A, an LED light assembly 112 includes an LED-PCB subassembly 102 comprising an array 106 of a plurality of LEDs and a PCB component 104. The LEDs of the array are arranged in staggered rows. The LED light assembly 112 is aligned above a metallic heat sink 108. The heat sink 108 is preferably constructed of a relatively thick disc of copper alloy or aluminum that serves as a large heat sink to remove excessive heat from the LED array 106 when operating.

The surface of the heat sink 108 includes an array of raised regular surfaces or mesas 110 which in assembly 112 are soldered to thermal transfer pads of the corresponding LEDs in the array 106. The relationship of the mesas 110 and the individual LEDs of the array 106 is best seen in FIG. 6C. The mesas 110 are also arranged in staggered rows to align with the LEDs of the array 106. The electrical contacts of the LEDs are soldered to the PCB component 104. The LEDs in the array 106 may be, for example, Cree X-Lamp XR-E or Luxeon Rebel LEDs, depending on the needs of the specific application. The details of attachment may vary depending on the configuration of the LEDs chosen. For example, the Cree LED has electrical contacts on top and bottom, while other LEDs have electrical contacts only on the bottom. In the preferred embodiment of the LED light assembly 112, solder is advantageous used in the assembly process. The preferred embodiment of the LED light assembly 112 uses Indium alloy solder. An alternate embodiment of the LED light assembly 112 utilizes a thermally conductive (e.g., silver-filled) epoxy in lieu of solder.

Referring to FIG. 2A, a reflecting LED light assembly 202 similar to that of FIG. 1A incorporates a reflector component 204. The reflector component 204 provides a plurality of individual mini-reflectors 206, one for each LED of the array 106. The reflector component 204 is fabricated in the form of a circular plate. In the preferred embodiment the reflector component 204 is made of metal and the mini-reflectors 206 are formed by machining or by a formed metal process. The reflector component 204 may also be made of injection molded plastic with suitable metallization applied to form the mini-reflectors 206. As illustrated in FIG. 2A, the reflector component 204 aligns with the LED-PCB assembly 102 such that individual LEDs insert through centrally located cavities in the mini-reflectors 206. The reflector component 204, LED-PCB subassembly 102 (FIG. 1A), and heat sink 108 comprise the reflecting LED light assembly 202. The top plan view of FIG. 2B further illustrates the relationship of the reflector component 204, the heat sink 108, and the individual LEDs of the array 106 which are seated in corresponding mini-reflectors 206. The vertical sectional view of FIG. 2C further illustrates the LED array 106 and the PCB component 104, and the heat sink 108 of the reflecting LED light assembly 202. The raised mesas 110 are also visible in this figure. The thermal contact pad on the bottom of each LED is soldered to a corresponding mesa 110 on the heat sink 108 for optimal heat transfer.

FIG. 3 is a vertical sectional view of a through-hull LED illumination system 300 for a vessel in which a thermistor or similar heat sensor is located near the LED array 106. The heat sensor is connected to an LED driver board that can modify the power supplied to the LED array 106 to prevent over-heating and consequent thermal runaway in the LEDs. More specifically, the through-hull LED illumination system 300 includes LED-PCB subassembly 102. Thermistors or other thermal sensors 304 are situated near the array of LEDs 106 and the PCB component 104. This is accomplished by mounting the thermal sensors 304 in recesses formed in the heat sink 108. The thermal sensors 304 generate signals that provide feedback to LED driver boards 302. This feedback allows the LED driver boards 302 to reduce power to the LEDs of the array 106 when overheating occurs, preventing thermal runaway. In an alternative configuration of the through-hull illumination system 300 the thermal sensors 304 are located in the same space as the LED driver boards 302. The LED driver boards 302 preferably include Zener-diode circuits or other electrical means, allowing current to be shunted when an individual LED fails for any reason, thus enabling the system to continue to operate and limiting LED losses to individual units. The through-hull LED illumination system 300 may further include leak detection and fault detection circuits. See U.S. Pat. No. 7,044,623 of Mark S. Olsson et al. granted May 16, 2006 entitled "Thru-Hull Light," the entire disclosure of which is hereby incorporated by reference.

Referring FIGS. 4A and 4B, in another embodiment 402 of the present invention an optically transparent fluid, or gel or elastomer (not illustrated) fills the non-solid space 410 (FIG. 4B) between the LED-PCB subassembly 102 and a transparent front window 404. The window 404 is held in position with a ring support 406. An O-ring seal 408 is positioned between the ring support 406 and the LED-PCB subassembly 102. The heat sink 108 supports the LED and PCB subassembly 102, the reflector component 204, the window 404, and the ring support 406. The reflector component 204 is preloaded via O-ring 408 to engage the LED-PCB subassembly 102. The use of a clear fluid 410 to fill the space 410 between the LED-PCB subassembly 102 and the transparent front window 404 provides several advantages. It prevents condensation or fogging of the window 404, improves the performance of the reflector component 204 by reducing total internal reflection, and provides more even distribution of heat from the LEDs in the array 106. Examples of fluids which may be used include Fluorinert™ liquid FC-70, from 3M Manufacturing, and the 705 penta-phenyltrisiloxane, 710 Phenylmethyl Siloxane, and 200 Polydimethylsiloxane industrial fluids from Dow Corning®.

FIG. 5 illustrates the LED-PCB subassembly 102 mounted on a heating block 504. An intermediary solder preform layer 502 (FIGS. 5 and 6) is utilized to fabricate the LED illumination system 600. The solder preform layer 502 allows for heating and flow-soldering of the thermal transfer pads of the LEDs to the heat sink 108. The PCB 104 has apertures 602 that allow the PCB 104 to fit in recesses formed in the heat sink 108 between the mesas 110. An assembly/manufacturing process step is illustrated in FIG. 6A in which the thin solder preform layer 502 is placed between LED array 106 and PCB component 104. The entire assembly is then placed on the heating block 504 (FIG. 5) which is ramped to an appropriate temperature for the type of solder employed allowing the elements of the solder preform layer 502 to melt and flow into position. This attaches the LED-PCB assembly 102 to the heat sink 108.

FIG. 6A illustrates the insertion of the solder preform layer 502 between the LED array 106 and the PCB component 104, prior to flow-soldering. Because of the apertures 602 in the PCB component 104, the flow-soldering process simultaneously joins the thermal transfer pads of the LEDs to the mesas 110 and the electrical contacts of the LEDs to the conductive traces of the PCB component 104 in a single operation. The solder preform layer 502 is fabricated with thin connectors joining regions of solder which match in shape and location the electrical contacts and thermal transfer pads of the LEDs of the array 106. These thin connectors melt, flow into, and join the mass of the liquid solder nearest them in the heating process. When the solder is re-flowed, copper traces 604 and 606 on the PCB component 104 are joined with electrical contacts on the LEDs located above the same. The PCB component 104 has additional copper traces (not illustrated) for connecting the LEDs of the array 106 with the LED driver boards 302.

The soldering technique described above joins the LEDs of the array 106 at their electrical contacts that are located on the bottom of the LEDs to integrate the LEDs into the circuitry of the PCB component 104. The LEDs of the array 106 are thermally joined with the heat sink 108. For LEDs with different electrical contact configurations the same principles and methods may be applied with adaptation of the detailed configuration of the solder preform, mesas and PCB contacts. In some embodiments, certain LED designs can allow the PCB component 104 to be placed on top of the LED array 106.

Low-temperature solder is preferably used to bond the LEDs of the array 106 to the heat sink 108. A low-temperature solder may be used whose composition is more than 50% Indium metal. A solder alloy may be considered low melting if it melts at temperatures below about 183° C. and above about 5° C. Most of the solder alloys that meet this requirement are made of five elements: Sn (tin), Pb (lead), Bi (bismuth), Ga (Gallium), and In (indium). The Cd (cadmium) bearing alloys are disfavored for commercial use because of their toxicity. Various compositions of these elements produce alloys that melt at any given temperature between 157° C. and 8° C. Examples of candidate solders include 43Sn43Pb14Bi, 58Bi42Sn, and 40Sn40In20Pb compounds. The spread of a solder is affected by the activity of the flux, the surface tension of the molten alloy, and the alloy's ability to make a metallurgical bond with the surface metallization.

A typical reflow solder profile the solder preform layer 502 requires ramping the temperature using the heating block 504 at a rate of about 0.5-1.5° C./sec to a range of ~160° C. for a maximum of 120 seconds preheating; followed by a temperature increase at a similar rate to a maximum of 215° C. for 45-90 seconds maximum, followed by temperature reduction at a maximum rate of 4° C./sec back to room temperature (50° C.). The temperatures and times will vary depending on the type of solder used—lead-free solder, for example, requires temperatures up to 260° C.

An alternative method may be used in which the soldering of the LEDs of the array 106 to the PCB component 104 is done as a separate step at high temperature, while a secondary step of soldering the LEDs to the mesas 110 is done at a lower temperature. The mesas 110 which join with the thermal transfer pads of the LEDs may be pre-coated with a barrier coating such as nickel to improve soldering and prevent solid-state diffusion between the Indium used in the solder and the copper used in the heat sink 108.

Turning now to FIG. 6B, the configuration of an exemplary LED 106a is shown in detail. Positive electrical contacts 608 and 614 and negative electrical contacts 610 and 616 are located, in this example, on the upper and lower surfaces of the LED housing. The LED's semi-conductor light-emitting element 618 (FIG. 6C) is centrally located under the protective transparent dome-shaped protective lens 619. A thermal transfer pad 612 is located at the bottom of the LED 106a to aid in thermal management of the LED 106a.

Referring to FIG. 6C, the light-emitting element 618 of each individual LED 106a is shown centrally situated above the thermal transfer pad 612 with the solder preform layer 502 shown under the two electrical contacts 608 and 610. In this vertical sectional view, portions of the PCB component 104 are seen surrounding the mesas 110. The mesas 110 connect the heat sink 108 and the thermal transfer pad 612 for each LED 106a. In the preferred embodiment, a copper alloy is used for the heat-sink material. The heat sink 108 is preferably made of an alloy having more than 50% copper by weight. Any thermally conductive material which can be attached through soldering or comparable means may be used. Where a copper-alloy is used for the heat sink 108, it may be coated with a surface layer of 50 μ-inches of nickel as a barrier to solid-state diffusion between the copper alloy and the Indium solder compound. This prevents brittlization of the copper. In one alternative embodiment, the heat sink 108 may be made of aluminum. The aluminum may be soldered to directly or plated to facilitate soldering. It is anticipated that as LEDs evolve into higher power ratings, higher-temperature LED arrays may be used requiring differing materials for thermal management. Such new classes of LEDs are readily adaptable to the various aspects of the present invention. Anodized aluminum mesas may be plated to create a solder-wettable surface for attachment.

FIG. 6D diagrammatically illustrates the heat sink 108 transferring thermal energy 626 through a protective, anti-corrosive but thermally conducting layer of titanium 622 to a surrounding body of water 624. The titanium layer 622 is attached by means of a thin layer of an appropriate, thermally conductive bonding agent 620. The location of the solder preform layer 502 under the electrical contacts and thermal transfer pad of the LED 106a is illustrated.

Turning now to FIG. 6E, alternative embodiments of the LED illumination system of the present invention may utilize an LED 650 that has a different construction. This construction is exemplified by the Luxeon Rebel LED. The LED 650 has two electrical contacts 656 (the second being hidden in this view) and a thermal transfer pad 658 attached to the bottom of a ceramic substrate 654. The LED 650 has a transparent dome-shaped protective lens 652.

Different structures for reflecting LED light may be used in the LED illumination systems of the present invention in order to control the shape and diffusion of their output beams. For example, Cubic Zirconia spheres or faceted structures may be used to steer emitted light. Moveable reflectors, either flat or formed in curves, may also be used. See U.S. patent application Ser. No. 12/021,102 of Mark S. Olsson filed Jan. 28, 2008 entitled "LED Illumination Device with Cubic Zirconia Lens," the entire disclosure of which is hereby incorporated by reference. Referring to FIG. 6F, an LED illumination system 659 incorporates an LED 666 in the form of a Luxeon Rebel LED, with its protective dome trimmed away. A Cubic Zirconia sphere 664 is attached between the LED 666 and a transparent window 660. The space between the window 660 and the LED 666, and surrounding the sphere 664, is optionally filled with 3M Fluorinert™ liquid FC-70 optically clear fluid 662 or comparable fluid, oil or gel. The structure and orientation of the Cubic Zirconia sphere 664 define the quality and direction of the emitted light beam.

Referring to FIG. 6G, the Cubic Zirconia sphere 664 may be moved between positions 664a and 664b through mechanical means. Small adjustments in the orientation of the sphere 664 modify the direction of the emitted beam, providing a steerable output light beam 670a, 670b. The first and second positions of the sphere 664a, 664b, and their respective output beams 670a, 670b, are illustrated by solid and dashed lines, respectively The use of steerable light emission from LEDs may be broadly applied to any LED illumination system using light beams as a means of information or control transmissions, small-scale inspections or similar applications. In an alternative embodiment, small-scale reflectors of flat, curved, parabolic, or other configurations of lens elements may be used in place of the illustrated sphere using mechanical means to move and control the reflectors. Such mechanical moving means may include micro-electronic mechanical devices, fluidic devices, pneumatic devices, shape-memory devices, and similar means.

FIG. 7A illustrates an underwater light fixture 702 suitable for deep-submersible applications such as lighting mounted to ROVs. The light fixture 702 has a housing 710 that holds an LED assembly 711. The housing 710 is threaded to a window-holding clamp form 704. The light fixture 702 is provided with a pressure-compensating mechanism that adapts it for deep submersible applications. Referring to FIG. 7B a non-corrosive titanium layer 714 and appropriate seals are used to protect a heat-sink component 712 from exposure to an external marine environment. A transparent window 706 is held in place by a threaded clamp form 704. Other means of attachment of the transparent window 706 can be used such as bolting, press-fitting, or the like. The material of the heat-sink component 712 is primarily copper. A quantity of optical fluid 708 occupies all the otherwise open space between the LED assembly 711 and the window 706, which aids in pressure-distribution and optimum beam-forming. The transparent window 706 can be made of slightly flexible material such that it will transmit pressure from ambient depth to the internal, oil-filled side of the light fixture 702, thus providing pressure-compensation. A flexible compensating rubber or soft plastic bellows (not illustrated in FIGS. 7A and 7B) may also be used for pressure compensation.

Referring to FIGS. 8A-8C, a thru-hull LED illumination system 802 has a generally cylindrical upper metal housing 804, a knurled threading ring 818 and a generally cylindrical lower non-metallic housing 824. The thru-hull LED illumination system 802 includes a metal heat sink forming a part of a jacking ring 840 that surrounds the outer end of the upper housing 804. The jacking ring 840 has a plurality of radially extending fins that are in thermal contact with ambient air inside of the vessel's hull to assist in heat dissipation. The jacking ring 840 is pushed against a jacking plate 851 via screws 843 pulling the flange formed on the outermost end of the metal housing 804 against the exterior of the vessel's hull.

A double seal system hereafter described allows maintenance personnel to access an internal fuse assembly and electrical power connections without disturbing the thru-hull seal or compromising the system's watertight integrity. The upper housing 804 encloses the LED-PCB subassembly 102 and the heat sink 108. The LED driver boards 302 which provide and modulate power to the LED array 106 are located in a sealed area behind the heat sink 108. A transparent protective lens 829 extends across the forward end of the upper housing and is sealed via an O-ring. The LED driver boards 302 are supported by a mount 830 and secured by locking mechanism 832. A sealing system comprising a retaining ring 806, O-ring seal 810, a seal retaining ring 812, and inner housing cap 828 assure the integrity of the space in which the LED driver boards 302 reside. The lower housing 824 allows access to electrical power connectors 821 and the fuse assembly 822 and is separately sealed using O-ring 814 and knurled threading ring 818. O-ring 816 serves as a friction lock to retain ring 818 into the upper housing 804. O-ring 850 similarly seals heat sink 108. The knurled locking ring 818 threads into the upper housing 804 to firmly seat the inner seals. The double seal design allows ready access to electrical power connectors 821 and a fuse assembly 822 without compromising the water-tight seal of the upper housing 804 or the integrity of the clamp type thru-hull fitting assembly. A cable 827 extends through a cable sealing gland 826 that is secured in the end of the lower housing 824. The double seal also allows the cable 827 to be readily replaced without having to disturb the integrity of the water-tight seal that protects the LED driver boards 302.

Referring to FIG. 8C, the driver boards 302 for the LED array 106 are mounted onto heat-sink plate 830 in the central cavity of the upper housing 804. A screw 832 and a pin 834 are associated with the heat-sink plate 830. The screw 832 has a conical tip that tightens against pin 834, which presses against the inner wall of the upper housing 804. The screw 832 may be turned using a hex-wrench. By tightening the screw 832, the cones at the ends of the screw 832 and the pin 834 will force a lateral wall of the heat-sink connected to the LED driver boards 302 into firm contact with the internal sidewall of the upper housing 804. When the thru-hull LED illumination system 802 is installed through an opening in a vessel's hull the upper end of the upper housing 804 is in direct contact with relatively cool ambient sea, river or lake water. A thermal path is established via screw 832 and pin 834 and contact of driver heat sink 830 with the interior wall of the metal upper housing 804 that will drain excess heat from the LED driver boards 302. This improvement in the thermal management of an LED illumination system allow more PCBs to be included in the system, and hence more closely packed LEDs, without thermal overload of the components or requiring some special means of thermal management. Heat generated by the LED array 106 can also be more effectively dissipated if the window 829 is made of a transparent material that has a high degree of thermal conductance, such as sapphire. Heat from the LED array 106 is also transferred through the heat sink 108 and then through the metallic upper housing 804 into the water outside the vessel's hull. The fins of the jacking ring 840 also increase the efficiency of heat dissipation from the thru-hull LED illumination system 802.

FIG. 8D-8F illustrate an alternate embodiment of a thru-hull LED illumination system 853 similar to that of FIGS. 8A-8C. The system 853 also has an upper housing 854, a knurled threading ring 818, a lower housing 824, and an external power cable connector 826. The outer housing 854 encloses the LED-PCB subassembly 102 and a threaded heat-sink block 852. The thru-hull LED illumination system 853 has a "bat wing" assembly for supporting the LED driver electronics, comprised of a central anodized aluminum plate 856, a rear plastic anti-rotation plate 858, two indexing roll pins 864, two fiberglass side wings 860, and eight plastic screws 862. This assembly provides vibration resistance, and double electrical resistance between the driver board and the upper housing 854 using the anodized aluminum and fiberglass side wings for insulation. An alternate embodiment of the bat wing assembly uses high strength plastic rails, made of suitable plastic such as GE Ultem (Trademark) plastic. The system 853 uses a standard jacking ring 845 instead of the jacking ring 840 that has heat sink fins.

Referring to FIG. 8G an alternative embodiment 870 of the thru-hull LED illumination system of FIGS. 8D-8F has silver or nickel brazed components including a 316L SS face plate 876, a 316L SS upper housing 874, and copper or copper alloy inner sleeve 878. The threaded heat-sink block 852 transfers heat to the copper or copper alloy inner sleeve 878, transferring heat more efficiently to the ocean water via face plate 876.

Referring to FIG. 9A, LEDs of different wavelengths can be combined in a single LED illumination system to provide, for example, a dual-purpose light capable of illuminating a near field of view underwater, using white light, and a further field of view underwater using light closer to 500-560 nm in wavelength. The latter band covers aquamarine to green, which provides deeper penetration in a marine environment.

An LED array 902 includes a plurality of individual LEDs seated in individually formed or separately inserted reflectors 904 and 908. The LEDs 906 that emit light in the green section of the spectrum are mounted in reflectors 904 disposed in an inner ring, while the outer ring is composed of LEDs 910 that emit white light such as 910 are mounted in reflectors 908 disposed in an outer ring. Specific applications may use different combinations of wave-lengths and different configurations of reflectors to vary the depth and angle of emitted light from the various LEDs used. Combined or alternative thru-hull LED illumination systems enable pleasure boat operators to aesthetically surround their vessels with various visually attractive combinations of hue, for example. The use of multi-wavelength combinations also enables scientific applications. Combining white LEDs with single-color LEDs such as blue and green to optimize light output underwater allows control of the emitted light beams according to their wave-length.

An underwater LED inspection light can use infra-red to red wavelength emitters which in combination with the appropriate viewing or recording lenses or devices allows for studies of deep-water animal behavior that are non-invasive and non-perturbing to the subjects of observation. The use of LEDs having emissions in the ultraviolet band, combined with the proper use of UV transparent materials and detectors, enables the detection of hydrocarbon leaks or migrations underwater, or the detection of certain magnetic particles and their patterns.

Referring to FIG. 9B, a combination of different fields of light can be generated using a configuration similar to that in FIG. 9A. In this example the outer-ring emitters produce a wide cone of white light useful for illuminating the near field of view, while the inner ring emitters such as 906 emitting a narrow light in the green band of the spectrum provide a far field of illumination, aided here by reflector 904. Referring to FIG. 9C, the same principle is illustrated as it applies to a white-band emitter 910 with reflector 908, emitting a near-field wide band of white light.

Referring to FIG. 10, a thru-hull LED illumination system 1002 incorporates a pressure-compensating membrane open to ambient water. This allows the internal pressure of the system 1002 to adjust to ambient pressure at depth. Other means such as a piston-driven or bellows-driven mechanism may be used to provide the pressure compensation in this embodiment. Tube 1010 penetrates through the outer housing 1008 to the interior compartment 1012 which is fitted with a flexible membrane 1006. The end of tube 1010 is open to the sea in underwater deployment, and transfers the ambient pressure at any depth to the membrane 1006 which expands or contracts accordingly. This effect, in turn, pressure-compensates the internal spaces such as the region containing the LED driver board 1004. In turn flexible membrane 1014 transfers ambient pressure to the LED array. The flexible membranes 1006 and 1014 may have a bulbous configuration and allow for the use of two compensating fluids, one selected for dielectric strength and the other for optical clarity around the LEDs. The flexible membranes 1006 and 1014 may have a bulbous configuration and may be made of suitable elastomeric material. In alternative embodiments, the pressure compensating mechanism is a bellows, a piston, or some similar device. In another alternative embodiment, the transparent lens covering the LEDs may function as a piston in a bore, providing pressure compensation to the LEDs alone, while the heat sink acts as a pressure barrier to keep the driver electronics isolated from ambient ocean pressure.

Referring to FIGS. 11A and 11B, a miniature thru-hull LED lighting system 1102 includes an external housing 1103, a rear seal plug 1104, an external power connection 826 and power cable 827. An integrated light cartridge 1105 is interchangeable by insertion into the external housing 1103. A transparent plastic window 1120 is held in place in the external housing 1103 by a threaded window support ring 1123, and sealed with O-rings 1121 and 1122, which maintain the water tight integrity of the thru-hull fitting. The integrated light cartridge 1105 threads into the external housing 1103 from the backside, making thermal contact with the outer flange housing 1103 through thread engagement. The integrated light cartridge 1105 is driven by the rear seal plug 1104 (FIG. 11A) through the canister 1105, making installation or removal relatively simple without compromising the seal of the external housing 1103 or the integrity of the thru-hull fitting while the vessel is in the water. Referring to FIG. 11C, the integrated light cartridge 1105 is composed of an LED or LEDs 1107 affixed to a metal core printed circuit board (MCPCB) 1108. Below the MCPCB 1108 is a thermally conductive interface material 1109. A reflector 1106 is pressed down on the MCPCB 1108 to force contact between the MCPCB 1108, the thermal interface material 1109, and the upper heat sink element of a canister 1110. The reflector 1106 is held by a press fit into a recess in the front end of the canister 1110. Electrical wires pass through the heat sink to the rear space where the LED driver board 1114 is located. The LED driver board, which modulates power to the LED or LEDs, is located in a space behind the LEDs. The driver board 1114 positions a thermal sensor 1112 near the back side of the LED heat sink to accurately monitor the heat generated. The sensor provides a feedback control circuit to roll back power and prevent thermal runaway of the LED light assembly. Thermal coupling between the thermal sensor 1112 and heat sink element of canister 1110 is aided by a brass spring 1111, which helps conduct heat from the back of the heat sink to the vicinity of the thermal sensor. A silicone collar 1113 provides a thermal insulating jacket to help the thermal sensor 1112 read properly. A clamping mechanism comprised of a threaded jacking ring 848, jacking plate 846, and jacking screws 843 secure the lighting system 1102 in a through hole in the vessel's hull.

At the rear of canister 1110, rear seal plug 1104 is held in place by roll pin 1115, and sealed to the outer housing by O-ring 1118. A smaller roll pin 1117 preloads rubber grommet 1116 to hold the LED driver board 1114 in place with a tab that fits snugly within a relief in the rear seal plug 1104. A watertight compression fitting 826 fits into the rear seal plug 1104, securing and sealing the power cable 827 as it passes into the interior of the light fixture.

Referring to FIG. 12A, multiple LED sources can be focused using individual reflector elements, either placed singly on each LED within a centering frame, or molded as a complete assembly. Multiple LED sources can be focused using individual Total Internal Reflection (TIR) plastic lenses either in air space or immersed in a fluid of appropriate refractive index. Multiple LED sources can be focused using individual metalized reflectors where the volume in front of the LED and inside the reflector is filled with a clear, high transmissivity plastic material of appropriate refractive index to which the reflective metalized coating is applied to the exterior surface. Conventional industry practice is illustrated in FIG. 12A, where a plastic reflector 1202 surrounds an exemplary LED 650 and has its interior surface metal coated 1210 for improved reflectivity. Referring to FIG. 12B, in another conventional arrangement a TIR plastic lens 1204 surrounds an exemplary LED 650 which relies on the difference in refractive index between the solid plastic body and air 1206 to create a reflective surface.

FIG. 12C illustrates another LED illumination system 1207 of the present invention in which a metal coating 1210 is applied to the exterior of a clear, high transmissivity plastic material 1204 of appropriate refractive index to form a reflector. The reflector surrounds an exemplary LED 650 for use immersed in a fluid of similar refractive index 1208. The reflective surface is created at the metal surface, where the clear, high transmissivity plastic material substitutes directly for the pressure compensating fluid as a result of the selected material's refractive index.

While we have described numerous embodiments of our LED illumination system in detail, modifications and adaptations thereof will occur to those skilled in the art. For example, strobe lamps could be mounted in the external housing to act as a warning or homing beacon or to provide illumination for underwater photography. The LED assembly in the thru-hull configuration could be replaced with a camera or there could be a combination of a camera and a device for illuminating the field of view of the camera. Therefore, the protection afforded our invention should only be limited in accordance with the scope of the following claims.

What is claimed is:

1. A submersible LED illumination system, comprising:
   an array of LEDs, a first portion of the LEDs capable of emitting white light and a second portion of the LEDs capable of emitting light of a single color;
   a plurality of reflectors, each reflector surrounding a corresponding one of the LEDs, a first portion of the reflectors being configured to provide a far field relatively narrow beam of illumination and a second portion of the reflectors being configured to provide a near field relatively wide beam of illumination;
   a housing enclosing the array of LEDs and the reflectors;
   a transparent window extending across the array of LEDs;
   pressure compensating means mounted in the housing to adjust internal pressure in the housing in relation to ambient pressure outside the housing; and
   a seal between the window and the housing.

2. The LED illumination system of claim 1 wherein the second portion of the LEDs include LEDs that emit substantially blue light.

3. The LED illumination system of claim 1 wherein the second portion of the LEDs include LEDs that emit substantially green light.

4. The LED illumination system of claim 1 and further comprising a PCB that supports the array of LEDs and a plurality of electrical contacts of the LEDs are electrically connected to the PCB.

5. The LED illumination system of claim 4 and further comprising a heat sink mounted in thermal contact with a thermal transfer pad of each of the LEDs.

6. The LED illumination system of claim 5, wherein the LEDs are bonded to the heat sink using a low-temperature solder.

7. The LED illumination system of claim 4, wherein the LEDs are bonded to the PCB using a high temperature solder and the LEDs are bonded to one or more mesas using a low temperature solder.

8. The LED illumination system of claim 1 wherein the plurality of reflectors are formed as individual mini-reflectors in a common reflector component.

9. The LED illumination system of claim 1, wherein the LEDs and reflectors are further enclosed in a cartridge configured to be removably mounted in the housing without breaking the seal between the window and the housing.

10. The LED illumination system of claim 1 wherein the white light emitting LEDs are mounted in an outer ring that surrounds the colored light emitting LEDs and wherein the white light emitting LEDs are each surrounded by a reflector configured to provide a near field relatively wide beam of illumination and the colored light emitting LEDs are each surrounded by a reflector configured to provide a far field relatively narrow beam of illumination.

11. The LED illumination system of claim 1 and further comprising a quantity of a fluid having a pre-selected index of refraction surrounding the LEDs.

12. The LED illumination system of claim 1, wherein the pressure compensating means comprises a flexible membrane with at least one opening, wherein the LED illumination system further comprises a pathway with a first opening that is connected to the opening of the flexible membrane and a second opening that is disposed to receive an external fluid existing outside of the housing, and wherein the pathway is disposed to transfer the external fluid into the flexible membrane in response to a change in ambient pressure outside of the housing.

13. The LED illumination system of claim 1, wherein the pressure compensating means comprises:
   a flexible membrane with at least one opening; and
   a pathway with a first opening that is connected to the opening of the flexible membrane and a second opening that is disposed to exchange a fluid between the flexible membrane and an area inside the housing that surrounds the LEDs in response to a change in ambient pressure outside of the housing.

14. The submersible LED illumination system of claim 1, further comprising an optically clear material disposed between the array of LEDs and the transparent window.

15. The submersible LED illumination system of claim 14, wherein the optically clear material comprises an optically clear oil.

16. The submersible LED illumination system of claim 14, wherein the optically clear material comprises a gel.

17. The submersible LED illuminations system of claim 14, wherein the optically clear material comprises an elastomeric material.

18. The submersible LED illumination system of claim 14, wherein the transparent window comprises a sapphire material.

19. The LED illumination system of claim 1, wherein the housing is configured as a through-hull housing.

20. The LED illumination system of claim 1, wherein the housing is configured to withstand underwater pressure.

21. The LED illumination system of claim 20, wherein the array of LEDs includes one or more infra-red LEDs.

22. The LED illumination system of claim 20, wherein the array of LEDs includes one or more ultraviolet LEDs.

23. The LED illumination system of claim 1, further including a structure disposed to dissipate heat generated by the LEDs to water external to the housing.

24. A submersible LED illumination system comprising:
   an array of LEDs, a first portion of the LEDs capable of emitting white light and a second portion of the LEDs capable of emitting light of a single color;
   a plurality of reflectors, each reflector surrounding a corresponding one of the LEDs, a first portion of the reflectors being configured to provide a far field relatively narrow beam of illumination and a second portion of the reflectors being configured to provide a near field relatively wide beam of illumination;
   a housing enclosing the array of LEDs and the reflectors;
   a transparent window extending across the array of LEDs;

a PCB that supports the array of LEDs and a plurality of electrical contacts of the LEDs are electrically connected to the PCB;

a heat sink mounted in thermal contact with a thermal transfer pad of each of the LEDs;

one or more driver circuits mounted in the housing and connected to the array of LEDs, wherein the one or more driver circuits control power to the array of LEDs;

one or more thermal sensors connected to the one or more driver circuits and mounted in respective one or more recesses of the heat sink, wherein the one or more thermal sensors are disposed to generate signals that affect power distribution to the array of LEDs; and a seal between the window and the housing.

25. The submersible LED illumination system of claim 24, wherein the housing is a first housing and the seal is a first seal, the submersible LED illumination system further comprising:

an electrical connector for supplying power to the one or more driver circuits;

a second housing enclosing the electrical connector;

an electrical cable that extends into the second housing and connects to the electrical connector;

a second seal for sealing the lower housing to the first housing to permit the electrical cable to be replaced without disturbing the second seal;

a quantity of an optically-transparent fluid having a preselected appropriate index of refraction surrounding the LEDs, wherein the optically transparent fluid is disposed to prevent fogging of the transparent window, reduce internal reflection and provide even distribution of heat from the array of LEDs; and a mechanical means for adjusting an orientation of the plurality of reflectors.

26. The submersible LED illumination system of claim 24, wherein the heat sink is a first heat sink, the submersible LED illumination system further comprising:

a second heat sink mounted in thermal contact with the one or more driver circuits and an internal wall of the housing; and a copper alloy inner sleeve mounted in thermal contact to the first heat sink.

* * * * *